(12) United States Patent
Ide et al.

(10) Patent No.: US 8,912,644 B2
(45) Date of Patent: Dec. 16, 2014

(54) SEMICONDUCTOR DEVICE AND METHOD FOR MANUFACTURING SAME

(71) Applicant: Hitachi, Ltd., Tokyo (JP)

(72) Inventors: Eiichi Ide, Hitachi (JP); Toshiaki Morita, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/870,216

(22) Filed: Apr. 25, 2013

(65) Prior Publication Data

US 2013/0299962 A1 Nov. 14, 2013

(30) Foreign Application Priority Data

May 11, 2012 (JP) ................... 2012-109939

(51) Int. Cl.
| | | |
|---|---|---|
| H01L 23/34 | (2006.01) | |
| H01L 23/495 | (2006.01) | |
| H01L 23/10 | (2006.01) | |
| H01L 23/433 | (2006.01) | |
| H01L 23/36 | (2006.01) | |

(52) U.S. Cl.
CPC .......... *H01L 23/34* (2013.01); *H01L 23/49575* (2013.01); *H01L 23/49562* (2013.01); *H01L 2224/32245* (2013.01); *H01L 23/49537* (2013.01); *H01L 23/4334* (2013.01); *H01L 23/36* (2013.01); *H01L 23/49513* (2013.01)
USPC .......... 257/712; 257/675; 257/706; 257/718; 257/719; 257/720

(58) Field of Classification Search
CPC ................ H01L 2924/01079; H01L 23/4334; H01L 23/367; H01L 2224/16; H01L 23/4093; H01L 24/72
USPC ......... 257/706, 675, 712, 720, 722, 713, 718, 257/719
See application file for complete search history.

(56) References Cited

U.S. PATENT DOCUMENTS

| | | | |
|---|---|---|---|
| 2003/0155645 A1* | 8/2003 | Ito .................................. | 257/712 |
| 2012/0200164 A1* | 8/2012 | Nakatsu et al. .................. | 307/82 |
| 2013/0056861 A1* | 3/2013 | Gao et al. ....................... | 257/675 |

FOREIGN PATENT DOCUMENTS

JP 2005-136018 A 5/2005

* cited by examiner

*Primary Examiner* — Matthew Reames
*Assistant Examiner* — Dilinh Nguyen
(74) *Attorney, Agent, or Firm* — Volpe and Koenig, P.C.

(57) ABSTRACT

A semiconductor device includes an IGBT as a vertical semiconductor element provided between first, and second lead frames, in pairs, the first, and second lead frames being opposed to each other, first and second sintered-metal bonding layers provided on first and second bonding surfaces of the IGBT, in pairs, respectively, a through-hole opened in the second lead frame, and a heat-release member having a surface on one side thereof, bonded to a second sintered-metal bonding layer of the second bonding surface while a side (lateral face) of a surface of the heat-release member, on the other side thereof, being fitted into the through-hole. A solder layer is formed in a gap between an outer-side wall of the side of the surface of the heat-release member, on the other side thereof, and an inner-side wall of the through-hole.

10 Claims, 17 Drawing Sheets

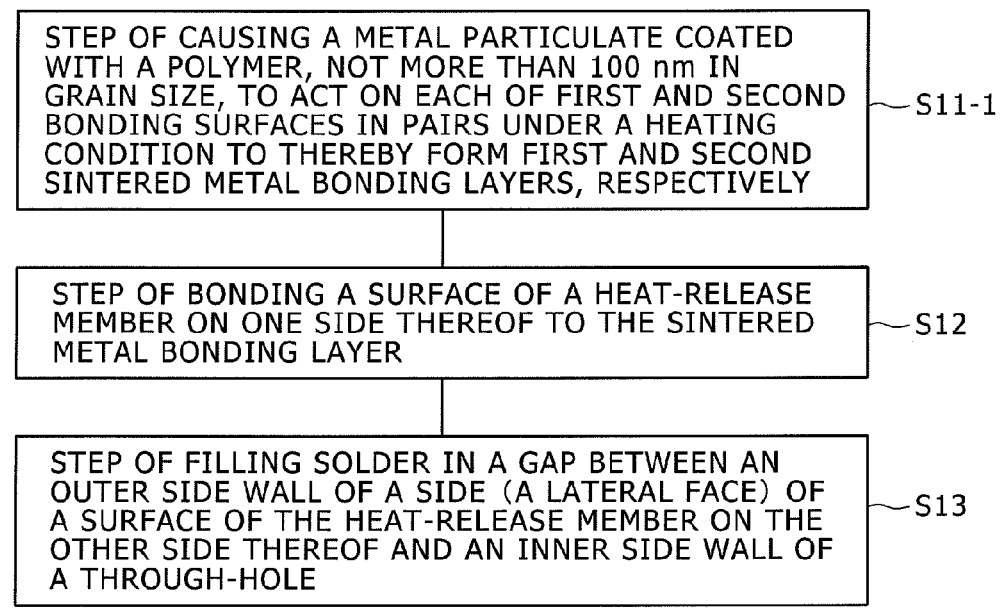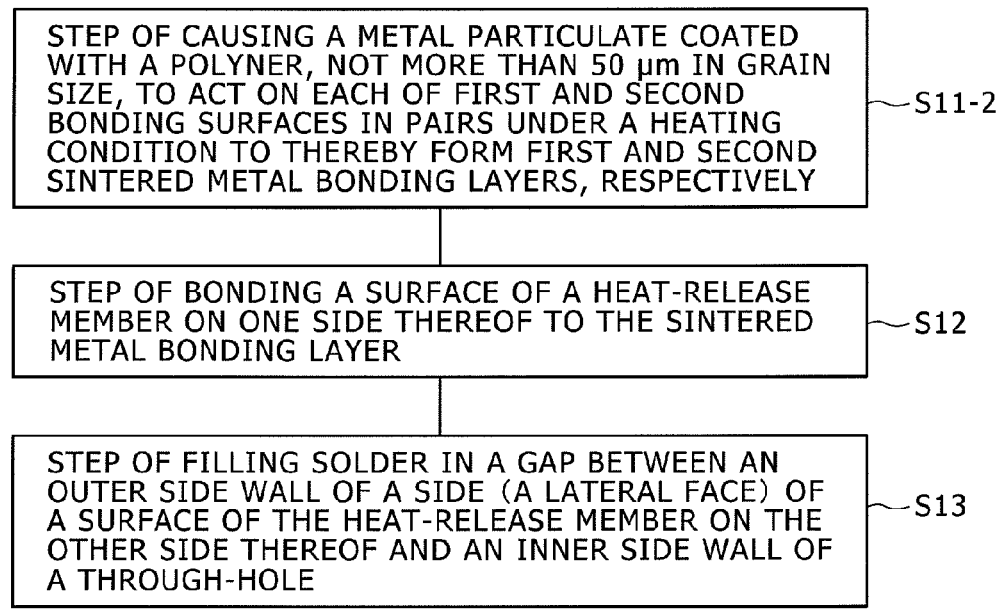

SEMICONDUCTOR DEVICE AND METHOD FOR MANUFACTURING SAME

TECHNICAL FIELD

The invention relates to a semiconductor device, and a method for manufacturing the same.

BACKGROUND

As a result of an increase in requirements for more energy saving as seen in recent years, an attention is being focused on, for example, an electric vehicle driven by an electric motor, and a hybrid vehicle driven by a an electric motor in combination with a reciprocating engine in the automobile field. In these vehicles, a semiconductor device with a power semiconductor element mounted therein is used in order to convert DC power supplied from an onboard battery into AC power to thereby drive a high-output electric motor. With the semiconductor device described as above, a heat value due to energization of the power semiconductor element is large, so that it is required to take heat-release properties into consideration.

A technology described in Japanese Unexamined Patent Application Publication No. 2005-136018 is well known as a technology for enhancing the heat-release properties of the semiconductor device with the power semiconductor element mounted therein. In Japanese Unexamined Patent Application Publication No. 2005-136018, there is described a semiconductor device made up by sequentially stacking a lower-side heat sink, a first solder layer, a semiconductor element, a second solder layer, a heat sink block, a third solder layer, and an upper-side heat sink to thereby cause the semiconductor element to be electrically connected between the upper-side heat sink and the lower-side heat sink via the first to third solder layers, respectively.

SUMMARY

However, with the technology according to Japanese Unexamined Patent Application Publication No. 2005-136018, bonding surfaces of the semiconductor element, in pairs, are electrically connected between the upper-side heat sink, and the lower-side heat sink through the intermediary of the first to the third solder layers, respectively. With the technology according to Japanese Unexamined Patent Application Publication. No. 2005-136018, however, because there exist as many as three layers of the solder layers low in heat-release properties, spread in the planar direction thereof throughout a direction in which the bonding surfaces of the semiconductor element, in pairs, are stacked, so that it has been difficult to implement enhancement in the heat-release properties of the semiconductor device.

Under circumstances described as above, the invention has been developed, and it is therefore an object of the invention to provide a semiconductor device incorporating a semiconductor element excellent in heat-release properties, and a method of manufacturing the semiconductor device.

To achieve the object, a semiconductor device according to an aspect of the invention has a most important feature in that the semiconductor device comprises a vertical semiconductor element having bonding surfaces, in pairs, the bonding surfaces being provided between bus bars, in pairs, the bus bars being opposed to each other, a sintered-metal bonding layer made of a sintered-metal, provided on each of the bonding surfaces, in pairs, a through-hole opened in at least one of the bus bars, in pairs, and a heat-release member having electrical conductivity, and a high thermal conductivity as compared with solder, a surface of the heat-release member, on one side thereof, being bonded to the sintered-metal bonding layer on at least one of the bonding surfaces, in pairs, while a side (a lateral face) of a surface of the heat-release member, on the other side thereof, being fitted into the through-hole. Further, a solder layer is formed in a gap between an outer-side wall of the side of the surface of the heat-release member, on the other side thereof, and an inner-side wall of the through-hole opened in at least the one of the bus bars, in pairs.

According to the aspect of the invention, there can be provided a semiconductor device incorporating a semiconductor element excellent in heat-release properties.

BRIEF DESCRIPTION OF THE DRAWINGS

FIG. 2A is a flow chart showing the steps of the semiconductor device manufacturing method according to the invention;

FIG. 2B is a flow chart showing the steps of a variation of the semiconductor device manufacturing method according to the invention;

DETAILED DESCRIPTION

Figure 1A:
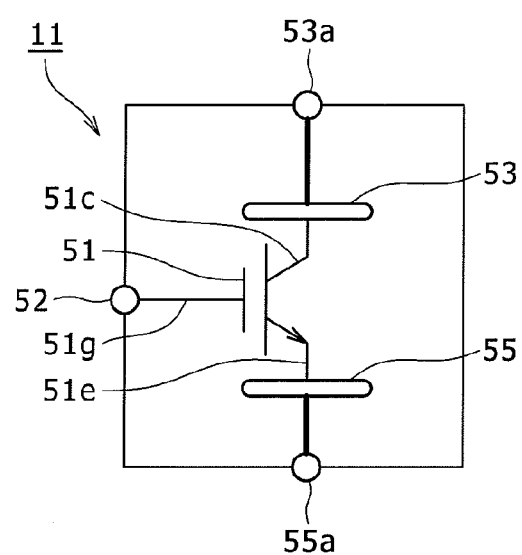
FIG. 1A is an electric circuit diagram of a semiconductor device according to a first embodiment of the invention.

Semiconductor devices, and semiconductor device manufacturing methods, according to plural embodiments of the invention, respectively, are described hereinafter with reference to the accompanied drawings.
(Circumstances Under which the Semiconductor Device, and the Semiconductor Device Manufacturing Method, According to the Invention, Respectively, have been Developed).

First, there are described hereinafter circumstances under which the semiconductor device, and the semiconductor device manufacturing method, according to the invention, respectively, have been developed. By the semiconductor device according to the invention is meant a concept incorporating the respective semiconductor devices according to the plural embodiments of the invention. Further, by the semiconductor device manufacturing method according to the invention is meant a semiconductor device manufacturing method for use at the time of manufacturing the respective semiconductor devices according to the plural embodiments of the invention.

The present applicant has proposed, for example, a bonding method (hereinafter referred to as "a sintered-metal bonding" on occasions) using a sintered-metal, capable of realizing high heat-release properties, and bonding reliability, as compared with a bonding method (hereinafter referred to as "a solder bonding" on occasions) using an existing solder, used at the time of electrical connection between the bonding surface of a semiconductor element and a lead frame. As a bonding material for use in the sintered-metal bonding, use can be made of a nanoparticle coated with a polymer, made of silver (Ag), copper (Cu), and so forth, or a silver oxide, a copper oxide, and so forth.

In the case of the sintered-metal bonding whereby electrical connection is made between the bonding surface of a semiconductor element and a lead frame, using, for example, Ag nanoparticles coated with a polymer, respectively, as the bonding material, the polymer is caused to disappear (due to a warming operation) in the course of bonding by adoption of the same temperature region (for example, from 100° C. to 300° C.) as that in the case of the bonding method adopted in the past to thereby enable the sintered-metal bonding to be performed at an interface between the bonding surface and the lead frame. Thereby, high heat-release properties, and bonding reliability can be realized.

However, in order to ensure a necessary thermal conductivity (heat-release properties), and an excellent electrical conductivity during the sintered-metal bonding, there has existed the need for applying a pressure such that bonding target members are brought into intimate contact with each other. Furthermore, metal nanoparticles as the bonding material differ from a solder material in that the former is not melted at the time of the bonding, so that if tilting, and warp occur to the bonding target member, such tilting, and warp as described cannot be absorbed by the metal nanoparticles. For this reason, it has been cumbersome to administer precision with respect to the bonding target members. For those reasons, it has been difficult to apply the sintered-metal bonding capable of realizing high heat-release properties, and bonding reliability to manufacturing of the semiconductor device.
(Overview of the Semiconductor Device According to the Invention)

Accordingly, the inventor, et al. have decided to resolve those problems by selective application of either the solder bonding capable of absorbing tilting, and warp, occurring to the bonding target member, to thereby realize high bonding reliability, or the sintered-metal bonding capable of realizing high heat-release properties as well as bonding reliability in accordance with requirements of a bonding target region.

More specifically, for the semiconductor device according to the invention, there is adopted a configuration where the semiconductor device comprises a vertical semiconductor element having bonding surfaces, in pairs, the bonding surfaces being provided between bus bars, in pairs, the bus bars being opposed to each other, a sintered-metal bonding layer made of a sintered-metal, provided on each of the bonding surfaces, in pairs, a through-hole opened in at least one of the bus bars, in pairs, and a heat-release member having electrical conductivity, and a high thermal conductivity as compared with solder, a surface of the heat-release member, on one side thereof, being bonded to the sintered-metal bonding layer on at least one of the bonding surfaces, in pairs, while a side (a lateral face) of a surface of the heat-release member, on the other side thereof, being fitted into the through-hole, whereby a solder layer is formed in a gap between an outer-side wall of the side of the surface of the heat-release member, on the other side thereof, and an inner-side wall of the through-hole opened in at least the one of the bus bars, in pairs.

With the semiconductor device according to the invention, the sintered-metal bonding layer made of the sintered-metal is provided on each of the bonding surfaces of the semiconductor element, in pairs. Further, the surface of the heat-release member having electrical conductivity, and a high thermal conductivity as compared with solder, on the one side of the heat-release member, is bonded to the sintered-metal bonding layer on at least the one of the bonding surfaces, in pairs. In the case of, for example, a semiconductor device, of which high heat-release properties are required, the surface of the heat-release member, on the one side thereof, may be bonded to both the sintered-metal bonding layers, provided on the bonding surfaces, in pairs, respectively.

The through-hole is opened in at least the one of the bus bars. In the case of, for example, a semiconductor device, of which high heat-release properties are required, the surface of the heat-release member, on the one side thereof, may be bonded to both the sintered-metal bonding layers, provided on the bonding surfaces, in pairs, respectively. If there is adopted a configuration whereby the surface of the heat-release member, on the one side thereof, is bonded to both the sintered-metal bonding layers, provided on the bonding surfaces, in pairs, respectively, in the case of the semiconductor device, of which high heat-release properties are required, the through-hole may be provided in each of the bus bars, in pars. The side of the surface of the heat-release member, on the other side thereof, is fitted into the through-hole. Further, the solder layer is formed in the gap between the outer-side wall on the side of the surface of the heat-release member, on the other side-face thereof, and the inner-side wall of the through-hole opened in at least the one of the bus bars, in pairs.

With the semiconductor device according to the invention, the sintered-metal bonding layer made of the sintered-metal is provided on the bonding surfaces of the semiconductor element, in pairs, respectively, so that the respective bonding surfaces of the semiconductor element can be covered with a dense sintered-metal bonding layer having high heat-release properties, and bonding reliability. Further, the surface of the heat-release member having electrical conductivity, and a high thermal conductivity, on the one side thereof, is bonded to the sintered-metal bonding layer on at least the one of the bonding surfaces, in pairs, and the side of the surface of the heat-release member, on the other side thereof, is fitted into the through-hole, so that heat generated in the semiconductor element can be efficiently released via the sintered-metal bonding layer, and the heat-release member, respectively.

Moreover, with the semiconductor device according to the invention, electrical connection between the bus bar and the heat-release member is made using the solder bonding, so that even if tilting, and warp occur to the bus bar as the bonding target member, such tilting, and warp as described can be absorbed to thereby enable high bonding reliability to be ensured. Further, because a target region where use is made of the solder bonding is the gap between the outer-side wall of the side of the surface of the heat-release member, on the other side thereof, and the inner-side wall of the through-hole opened in at least the one of the bus bars, the solder layer at a disadvantage in respect of heat-release properties (low in thermal conductivity) no longer exists in a heat transfer path (the sintered-metal bonding layer, and the heat-release member) for the heat generated in the semiconductor element. As a result, it is possible to secure the heat transfer path having high heat-release properties.

(Configuration of a Semiconductor Device 11 According to a First Embodiment of the Invention)

Figure 1B:
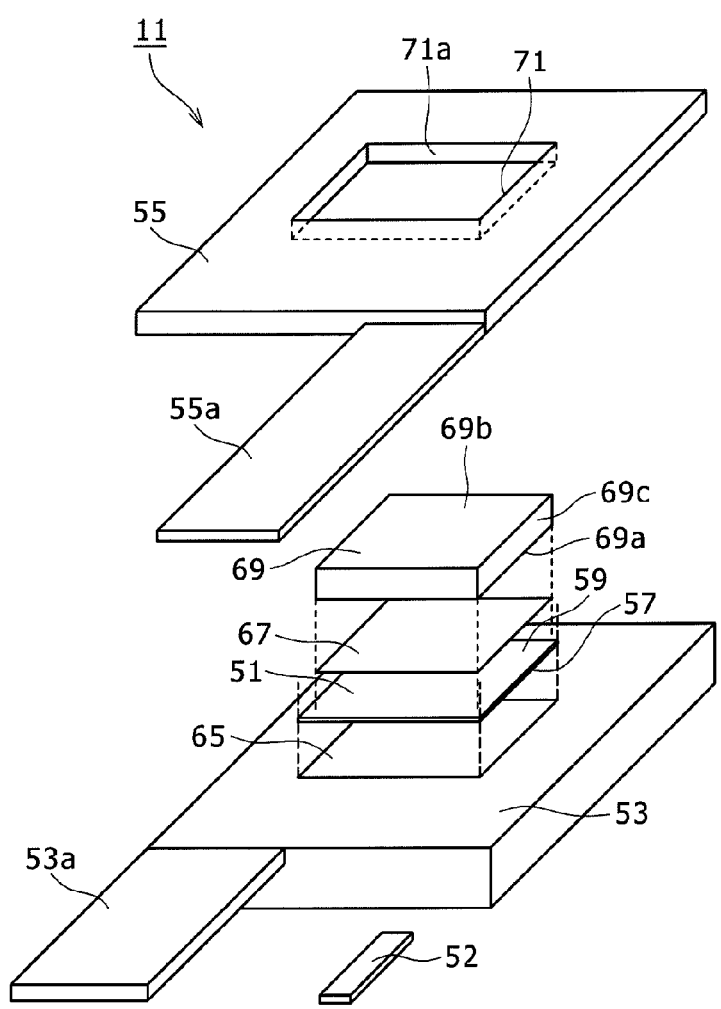
FIG. 1B is an assembly view of the semiconductor device according to the first embodiment, shown in FIG. 1A.
Figure 1C:
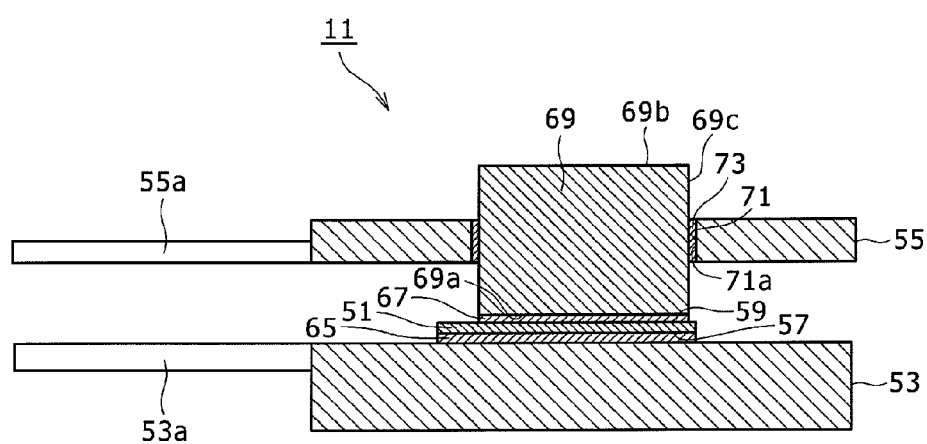
FIG. 1C is a sectional schematic diagram of the semiconductor device according to the first embodiment, shown in FIG. 1A.

Next, a semiconductor device 11 according to the first embodiment of the invention is described hereinafter with reference to FIGS. 1A to 1C, respectively. FIG. 1A is an electric circuit diagram of the semiconductor device 11 according to the first embodiment of the invention. FIG. 1B is an assembly view of the semiconductor device 11 according to the first embodiment, shown in FIG. 1A. FIG. 1C is a sectional schematic diagram showing a jointed state on the periphery of a semiconductor element 51 of the semiconductor device 11 according to the first embodiment, shown in FIG. 1A.

The semiconductor device 11 according to the first embodiment of the invention comprises an insulated gate bipolar transistor (hereinafter referred to as "an IGBT") 51 as a vertical semiconductor element having first and second bonding surfaces 57, 59, in pairs, (refer to FIGS. 1B, 1C) provided between first and second lead frames 53, 55, in pairs, the first and second lead frames being parallel with, and opposed to each other (corresponding to bus bars according to the invention, respectively) as shown in FIG. 1A.

The first and second lead frames 53, 55 are each made of an electrically conductive material having not only electrical conductivity, but also a high thermal conductivity (for example, in a range of about 220 to 400 W/m·K). There is no particular limitation to the electrically conductive material for use in the first, and second lead frames 53, 55, respectively; however, a metal material high in electrical conductivity, and thermal conductivity, such as, for example, copper, aluminum, or alloy of these metals (a Cu alloy, or an Al alloy), can be suitably used.

The IGBT 51 without a diode has a collector electrode 51c, an emitter electrode 51e, and a gate electrode 51g, as shown in FIG. 1A. The collector electrode 51c is connected to a collector terminal 53a via the first lead frame 53. The emitter electrode 51e is connected to an emitter terminal 55a via the second lead frame 55. The gate electrode 51g is connected to a gate terminal 52 via a wire (not shown).

The first and second bonding surfaces 57, 59, in pairs, are provided with first and second sintered-metal bonding layers 65, 67, respectively, each thereof, being made of a sintered-metal, such as Ag, Cu, and so forth, as shown in FIGS. 1B, and 1C, respectively. The first and second sintered-metal bonding layers 65, 67 each have a high thermal conductivity (for example, in a range of about 150 to 400 W/m·K), as compared with a solder material.

The first bonding surface 57 substantially rectangular in shape is tightly bonded to the first lead frame 53 through the intermediary of the first sintered-metal bonding layer 65. Thereby, even in the case where the IGBT 51 generates heat due to energization, the heat can be released to the first lead frame 53 at a high efficiency via the first bonding surface 57, and the first sintered-metal bonding layer 65, respectively.

On the other hand, the second bonding surface 59 substantially rectangular in shape is tightly bonded to a surface 69a of a heat-release member 69, on one side thereof, through the intermediary of the second sintered-metal bonding layer 67. The heat-release member 69 substantially cuboid in shape is made of an electrically conductive material having not only electrical conductivity, but also a high thermal conductivity (for example, in a range of about 220 to 400 W/m·K). There is no particular limitation to the electrically conductive material for use in the heat-release member 69, however, a metal material high in electrical conductivity, and thermal conductivity, such as, for example, copper, aluminum, or alloy of these metals, can be suitably used.

Suppose the IGBT 51 largely differs in thermal expansion coefficient from the heat-release member 69. In such a case, large thermal stress occurs to the second sintered-metal bonding layer 67 existing at a boundary part between the IGBT 51 and the heat-release member 69 due to heat generation occurring to the IGBT 51. Occurrence of such thermal stress becomes a large factor for shortening the service life of the semiconductor device 11 according to the first embodiment of the invention by causing occurrence of cracks in the second sintered-metal bonding layer 67, and so forth. A problem of such thermal stress can occur between the IGBT 51 and the first, and second lead frames 53, 55, respectively, as well.

From this point of view, a configuration is preferably adopted whereby the thermal expansion coefficient of the heat-release member 69 is set to a numerical value within a scope divided by the thermal expansion coefficient of the IGBT 51, and the respective thermal expansion coefficients of the first, and second lead frames 53, 55, as respective boundary values. If the thermal expansion coefficient of the heat-release member 69, in particular, is set to a numerical value within the scope, close to the thermal expansion coefficient of the IGBT 51 as the semiconductor element, this will be more preferable. This is because if the thermal expansion coefficient of the heat-release member 69 is at the numerical value close to the thermal expansion coefficient of the IGBT 51 as a heat generation source, thermal stress can be suppressed low, so that this will contribute to a longer service life of the semiconductor device 11 according to the first embodiment. A stock material whose thermal expansion coefficient is within the scope includes, for example, Mo, Cu—C, Al—C, and so forth.

A through-hole 71 substantially rectangular in shape is opened in a region of the second lead frame 55, corresponding to a surface 69b on the other side of the heat-release member 69, as shown in FIGS. 1B, and 1C. An inner-side wall 71a of the through-hole 71 is set slightly larger in size than an outer-side wall 69c of the surface 69b, on the other side of the heat-release member 69. A side of the surface 69b, on the other side of the heat-release member 69, is fitted into the through-hole 71 opened in the second lead frame 55. Then, solder 73 is filled in a gap between the outer-side wall 69c of the side of the surface 69b of the heat-release member 69, on the other side thereof, and the inner-side wall 71a of the through-hole 71 opened in the second lead frame 55.

At the time of applying the solder bonding to the gap, a spacer jig is preferably installed between the first and second lead frames 53, 55. This is because parallelism between the first and second lead frames 53, 55, and accuracy in height can be enhanced thereby. After the solder bonding, electrical connection (wire-bonding) is made between the gate electrode 51g of the IGBT 51 and the gate terminal 52 thereof (refer to FIG. 1A), using a wire made of, for example, gold and aluminum. The wire-bonding is carried out before the side of the surface 69b, on the other side of the heat-release member 69, is fitted into the through-hole 71 of the second lead frame 55.

(Function Effects of the Semiconductor Device 11 According to the First Embodiment of the Invention)

With the semiconductor device 11 according to the first embodiment of the invention, the first and second bonding surfaces 57, 59 of the IGBT 51, in pairs, are provided with the first and second sintered-metal bonding layers 65, 67, respectively, the sintered-metal bonding layers each being made up of the sintered-metal, so that the first and second bonding surfaces 57, 59 of IGBT 51 can be made up of the dense sintered-metal bonding layers 65, 67, having high heat-release properties, and bonding reliability, respectively.

Further, the surface 69a, on the one side of the heat-release member 69, is bonded to the second sintered-metal bonding layer 67 bonded to the second bonding surface 59, and the side of the surface 69b, on the other side of the heat-release member 69, is fitted into the through-hole 71 opened in the second lead frame 55, so that even if heat generation occurs to the IGBT 51, heat occurring to the IGBT 51 can ne efficiently released through the second sintered-metal bonding layer 67, and the heat-release member 69, respectively.

Furthermore, with the semiconductor device 11 according to the first embodiment, electrical connection between the second lead frame 55 and the heat-release member 69 is made by means of the solder bonding, so that even if tilting, and warp occur to the second lead frame 55 as a bonding target member, such tilting, and warp as described can be absorbed to thereby enable high bonding reliability to be ensured.

Further, the target region for the solder bonding is the gap between the outer-side wall 69c of the lateral face of the surface 69b of the heat-release member 69, on the other side thereof, and the inner-side wall 71a of the through-hole 71, so that the solder layer at a disadvantage in respect of heat-release properties (low in thermal conductivity) no longer exists in the heat transfer path (the second sintered-metal bonding layer 67, and the heat-release member 69) for the heat generated in the IGBT 51. As a result, the heat transfer path having high heat-release properties can be secured.

(Overview of the Semiconductor Device Manufacturing Method According to the Invention)

The semiconductor device manufacturing method according to the invention is described hereinafter with reference to FIGS. 2A, and 2B. FIG. 2A is a flow chart showing the steps of the semiconductor device manufacturing method according to the invention. FIG. 2B is a flow chart showing the steps of a variation of the semiconductor device manufacturing method according to the invention. The semiconductor device manufacturing method according to the invention is a method used in common with the semiconductor devices according to the invention. However, the case where the semiconductor device manufacturing method according to the invention is applied to a particular use in manufacturing the semiconductor device 11 according to the first embodiment is cited by way of example in the following description.

The semiconductor device manufacturing method according to the invention is a semiconductor device manufacturing method for use at the time of manufacturing the semiconductor device 11 made up by clamping the IGBT 51 as the vertical semiconductor element having the first and second bonding surfaces 57, 59, in pairs, provided between the first, and second lead frames 53, 55, in the pairs, the first, and second lead frames being opposed to each other.

For the semiconductor device manufacturing method according to the invention, there is adopted a configuration having the step (refer to step S11-1) of causing a metal particle (a nanoparticle made of Ag, Cu, and so forth) coated with a polymer, not more than 100 nm in grain size, to act on each of the first and second bonding surfaces 57, 59, in pairs, under a heating condition to thereby form the first, and second sintered-metal bonding layers 65, 67, made of a sintered-metal, respectively, as shown in FIG. 2A, the step (refer to step S12) of bonding the surface 69a of the heat-release member 69 having electrical conductivity, and a high thermal conductivity, as compared with solder, on the one side thereof, to the sintered-metal bonding layer (corresponding to the second, sintered-metal bonding layer 67 in the case of the semiconductor device 11 according to the first embodiment) of at least one of the first and second bonding surfaces, 57, 59, in pairs, and the step (refer to step S13) of filling the solder 73 in the gap between the outer-side wall 69c of the lateral face of the surface 69b of the heat-release member 69, on the other side thereof, and the inner-side wall 71a of the through-hole 71 while the side of the surface 69b of the heat-release member 69, on the other side thereof, is kept in such a state as fitted into the inner-side wall of the through-hole (corresponding to the through-hole 71 opened in the second lead frame 55 in the case of the semiconductor device 11 according to the first embodiment) opened in at least one of the first, and second lead frames 53, 55, in pairs.

With the semiconductor device manufacturing method according to the invention, first, the metal particle (the nanoparticle made of, for example, Ag, Cu, and so forth) coated with a polymer, not more than 100 nm in grain size, is caused to act on each of the first and second bonding surfaces 57, 59 of the IGBT 51, in pairs, under a heating condition to thereby form the first, and second sintered-metal bonding layers 65, 67, made of a sintered-metal, respectively. More specifically, an Ag nanoparticle is caused to act under a heating condition in a range of, for example, 100 to 300° C. to thereby form the first, and second sintered-metal bonding layers 65, 67, made of a sintered-metal, on the first and second bonding surfaces 57, 59, in pairs, respectively.

Subsequently, the surface 69a of the heat-release member 69, on the one side thereof, having electrical conductivity, and a high thermal conductivity, as compared with solder, is bonded to the sintered-metal bonding layer (for example, the second sintered-metal bonding layer 67) of at least the one of the first and second bonding surfaces 57, 59, in pairs. Then, a solder layer 73 is formed in the gap between the outer-side wall 69c of the side of the surface 69b of the heat-release member 69, on the other side thereof, and the inner-side wall 71a of the through-hole 71 while the side of the surface 69b of the heat-release member 69, on the other side thereof, is kept in such a state as fitted into the inner-side wall of the through-hole (for example, the through-hole 71 opened in the second lead frame 55) opened in at least one of the first, and second lead frames 53, 55, in pairs.

Further, as a variation of the semiconductor device manufacturing method according to the invention, a configuration may be adopted whereby "a metal oxide particle (for example, silver oxide, a copper oxide, and so forth) coated with a polymer, not more than 50 µm in grain size, is caused to act under a heating condition" (refer to the step S11-2 in FIG. 2B) is substituted for a configuration whereby "a metal particle coated with a polymer, not more than 100 nm in grain size, is caused to act under a heating condition" (refer to the step S11-1 in FIG. 2A). However, the steps S12 and S13 in FIG. 2B are identical to those in FIG. 2A, respectively.

In this connection, the metal oxide particle is a precursor of a metal oxide nanoparticle, in the process of production thereof. More specifically, a silver oxide particle is caused to act under a heating condition in a range of about 100 to 300° C. in, for example, a reducing atmosphere, such as a reducing gas, and so forth, to thereby form the sintered-metal bonding layers on each of the bonding surfaces, in pairs.

With the semiconductor device manufacturing method according to the invention, the metal oxide nanoparticle or the metal oxide particle coated with a polymer is caused to act on each of the first and second bonding surfaces 57, 59 of the IGBT 51, in pairs, under the heating condition, to thereby form the first and second sintered-metal bonding layers 65, 67, made of the sintered-metal, respectively, so that the first and second bonding surfaces 57, 59 (main electrode surfaces) of the IGBT 51 can be covered with the dense sintered-metal bonding layers 65, 67, having high heat-release properties and bonding reliability, respectively.

Further, the surface 69a of the heat-release member 69, on the one side thereof, having electrical conductivity, and a high thermal conductivity, as compared with solder, is bonded to the sintered-metal bonding layer (for example, the second sintered-metal bonding layer 67) on at least one of the bonding surfaces 57, 59, in pairs, while the side of the surface 69b on the other side of the heat-release member 69, is fitted into the through-hole 71 opened in the second lead frame 55, so that even if heat generation occurs to the IGBT 51, heat occurring to the IGBT 51 can ne efficiently released through the sintered-metal bonding layers 65, 67, and the heat-release member 69, respectively.

Furthermore, with the semiconductor device manufacturing method according to the invention, electrical connection between the second lead frame 55 and the heat-release member 69 is made using the solder bonding, so that even if tilting, and warp occur to the second lead frame 55 as a bonding target-member, such tilting, and warp as described can be absorbed to thereby enable high bonding reliability to be ensured. Further, because a target region for the solder bonding is the gap between the outer-side wall 69c of the side of the surface 69b of the heat-release member 69, on the other side thereof, and the inner-side wall 71a of the through-hole 71, the solder layer at a disadvantage in respect of heat-release properties (low in thermal conductivity) no longer exists in the heat transfer path (the second sintered-metal bonding layer 67, and the heat-release member 59) for the heat generated in the IGBT 51. As a result, it is possible to secure a heat transfer path having high heat-release properties.

Still further, with the semiconductor device manufacturing method according to the invention, the configuration is adopted whereby the step of filling the solder 73 in the gap is carried out after the step of forming the first, and second sintered-metal bonding layers 65, 67, so that even if a configuration is adopted whereby solder is melted for filling the gap by heating, for example, the IGBT 51 as the element in whole, this will not affect jointed states of the sintered-metal bonding layers 65, 67, respectively. This is because the sintered-metal as the respective constituents of the sintered-metal bonding layers 65, 67 has a melting point sufficiently high as compared with the melting temperature of the solder (in the case of a sintered-metal type being, for example, Ag, the melting point thereof is on the order of 960° C.).

Accordingly, with the semiconductor device manufacturing method according to the invention, the semiconductor device can be manufactured by an appropriate procedure established by taking into account a difference between various bonding materials.

(Configuration of a Semiconductor Device 111 According to a Second Embodiment of the Invention)

Figure 3A:
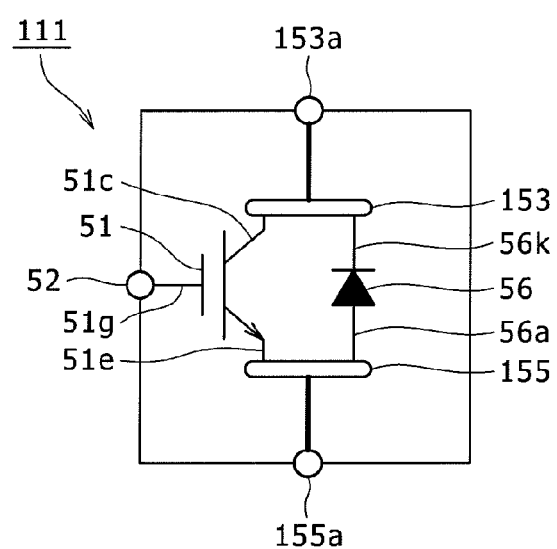
FIG. 3A is an electric circuit diagram of a semiconductor device according to a second embodiment of the invention.
Figure 3B:
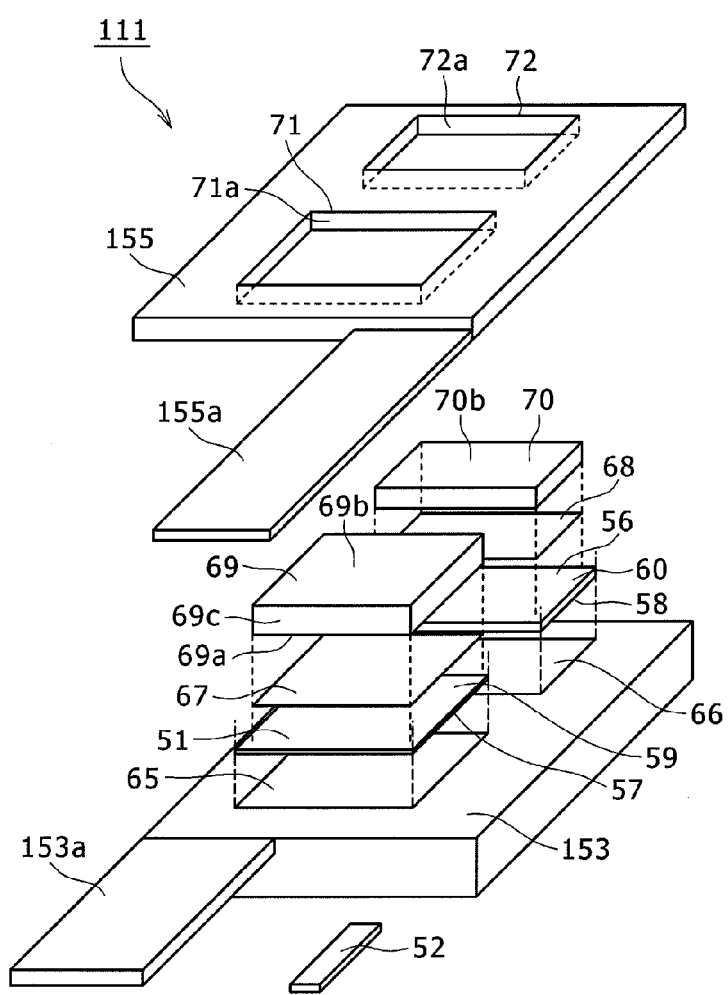
FIG. 3B is an assembly view of the semiconductor device according to the second embodiment, shown in FIG. 3A.
Figure 3C:
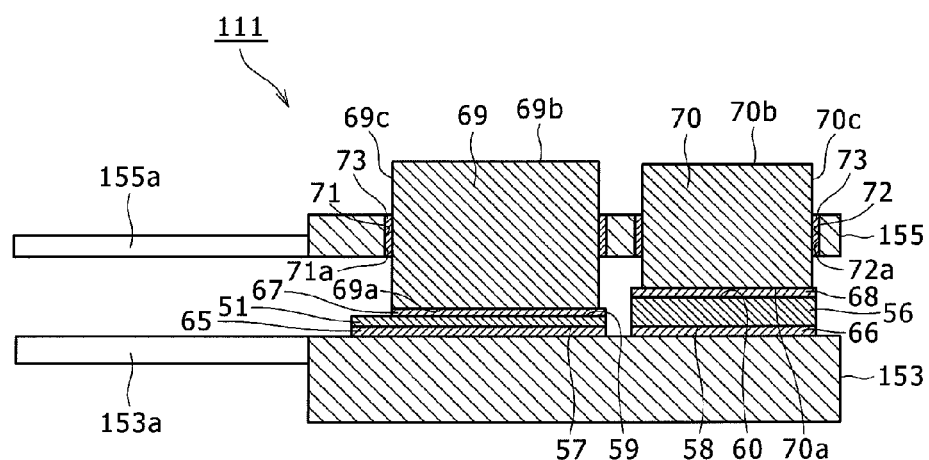
FIG. 3C is a sectional schematic diagram of the semiconductor device according to the second embodiment, shown in FIG. 3A.

Next, a semiconductor device 111 according to the second embodiment of the invention is described hereinafter with reference to FIGS. 3A to 3C, respectively. FIG. 3A is an electric circuit diagram of the semiconductor device 111 according to the second embodiment of the invention. FIG. 3B is an assembly view of the semiconductor device 111 according to the second embodiment, shown in FIG. 3A. FIG. 3C is a sectional schematic diagram showing jointed states on the respective peripheries of semiconductor elements 51, 56 of the semiconductor device 111 according to the second embodiment, shown in FIG. 3A.

There exist components common to the semiconductor device 11 according to the first embodiment of the invention comprises, and the semiconductor device 111 according to the second embodiment. Accordingly, the components effectively common to both the semiconductor device 11 and the semiconductor device 111 are each denoted by a common sign, omitting therefore description thereof, and proceeding with description while noting a difference therebetween, if any.

However, if there is the need for denoting even common components by signs different from each other, respectively, for the sake of convenience in explanation, a notation in accordance with the following rule is to be observed so as to enable a corresponding relationship between the components common to the first and second embodiments to be easily grasped at first glance. More specifically, numbers at lower two places of signs are common to respective signs given to the semiconductor device 11, and the semiconductor device ill. Further, a sign "1" is added to the head of the sign denoting the component of the semiconductor device ill. More specifically, if, for example, the second lead frame 53 according to the first embodiment is a common component corresponding to a second lead frame according to the second embodiment, the former is denoted by sign "53", and the latter is denoted by sign "153".

A difference between the semiconductor device 11 according to the first embodiment (refer to FIG. 1A) and the semiconductor device 111 according to the second embodiment (refer to FIG. 3A) lies in whether or not an IGBT 51, as the semiconductor common to both the semiconductor device 11, and the semiconductor device 111, has a diode. In other words, with the semiconductor device 11 according to the first embodiment, the IGBT 51 does not have a diode, whereas with the semiconductor device 111 according to the second embodiment, the IGBT 51 has a diode 56.

To describe in detail, the semiconductor device 111 according to the second embodiment is provided with a diode 56 as a vertical semiconductor element installed between first, and second lead frames 153, 155, in pairs, the first, and second lead frames being parallel with, and opposed to each other, as shown in FIG. 3A, the diode 56 having, for example, third and fourth bonding surfaces 58, 60, in pairs, in parallel with the IGBT 51 (refer to FIGS. 3B, 3C), in addition to the IGBT 51 according to the first embodiment. The diode 56 has an anode electrode 56a, and a cathode electrode 56K, respectively, as shown in FIG. 3A. For the diode 56 according to the second embodiment, as well, a heat-release structure similar to that in the case of the IGBT 51 according to the first embodiment is adopted as described hereunder.

The third and fourth bonding surfaces 58, 60 of the diode 56, in pairs, are provided with third and fourth sintered-metal bonding layers 66, 68, respectively, each thereof, being made of a sintered-metal, such as Ag, Cu, and so forth, as shown in FIGS. 3B, and 3C. The third and fourth sintered-metal bonding layers 66, 68 each have a thermal conductivity (for example, in the range of about 150 to 400 W/m·K) twice as high as the thermal conductivity (on the order of 35 to 70 W/m·K) of a solder material.

The third bonding surface 58 substantially rectangular in shape is tightly bonded to the first lead frame 153 through the intermediary of the third sintered-metal bonding layer 66. Thereby, even in the case where the IGBT 51 generates heat due to energization, the heat can be released to the first lead frame 153 at a high efficiency via the third bonding surface 58, and the first sintered-metal bonding layer 65, respectively.

On the other hand, the fourth bonding surface 60 substantially rectangular in shape is tightly bonded to a surface 70a of a heat-release member 70, on one side thereof, through the intermediary of the fourth sintered-metal bonding layer 68. The heat-release member 70 substantially cuboid in shape is made of an electrically conductive material having not only electrical conductivity, but also a high thermal conductivity (for example, in the range of about 220 to 400 W/m·K). There is no particular limitation to the electrically conductive material for use in the heat-release member 70, however, a metal material high in electrical conductivity, and thermal conductivity, such as, for example, copper, aluminum, or alloy of these metals (a Cu alloy, and an Al alloy) can be suitably used.

Further, as is the case with the first embodiment, a configuration is preferably adopted whereby the respective thermal expansion coefficients of the heat-release members 69, 70 are set to numerical values within a scope divided by the respective thermal respective expansion coefficients of the IGBT 51, the diode 56, each serving as the semiconductor element, and the respective thermal expansion coefficients of the first, and second lead frames 153, 155, as respective boundary values. The reason for this is because thermal stress that has occurred to the IGBT 51, and the diode 56, respectively, can be suppressed low to thereby contribute to a longer service life of the semiconductor device ill according to the second embodiment.

A through-hole 72 substantially rectangular in shape is opened in a region of the second lead frame 155, corresponding to a surface 70b on the other side of the heat-release member 70, in addition to the through-hole 71, as shown in FIGS. 3B, and 3C. An inner-side wall 72a of the through-hole 72 is set slightly larger in size than an outer-side wall 70c of the side of the surface 70b, on the other side of the heat-release member 70. The side of the surface 70b, on the other side of the heat-release member 70, is fitted into the through-hole 72 opened in the second lead frame 155. Then, solder 73 is filled in a gap between the outer-side wall 70c of the side of the surface 70b of the heat-release member 70, on the other side thereof, and the inner-side wall 72a of the through-hole 72 opened in the second lead frame 155.

(Function Effects of the Semiconductor Device 111 According to the Second Embodiment of the Invention)

With the semiconductor device 111 according to the second embodiment of the invention, the third and fourth bonding surfaces 58, 60 of the diode 56, in pairs, are provided with the third and fourth sintered-metal bonding layers 66, 68, each thereof being made of a sintered metal, respectively, so that the bonding surfaces 58, 60 of the diode 56 can be made up of the dense sintered-metal bonding layers 66, 68, having high heat-release properties, and bonding reliability, respectively.

Further, the surface 70a of the heat-release member 70, on the one side thereof, is bonded to the fourth sintered-metal bonding layer 68 bonded to the fourth bonding surface 60, and the side of the surface 70b, on the other side of the heat-release member 70, is fitted into the through-hole 72 opened in the second lead frame 155, so that even if heat generation occurs to the diode 56, heat occurring to the diode 56 can be efficiently released through the fourth sintered-metal bonding layer 68, and the heat-release member 70, respectively.

Moreover, with the semiconductor device 111 according to the second embodiment, electrical connection between the second lead frame 155 and the heat-release member 70 is made using the solder bonding, so that even if tilting, and warp occur to the second lead frame 155 as the bonding target member, such tilting, and warp as described can be absorbed to thereby enable high bonding reliability to be ensured.

Further, because a target region for the solder bonding is the gap between the outer-side wall 70c of the side of the surface 70b of the heat-release member 70, on the other side thereof, and the inner-side wall 72a of the through-hole 72, the solder layer at a disadvantage in respect of heat-release properties (low in thermal conductivity) no longer exists in a heat transfer path (the fourth sintered-metal bonding layer 68, and the heat-release member 70) for the heat generated in the diode 56. As a result, it is possible to secure the heat transfer path having high heat-release properties.

Now, with the semiconductor device 111 according to the second embodiment, the IGBT 51, and the diode 56, as the semiconductor elements independent from each other, are provided in parallel with each other between the first and second lead frames 153, 155 being parallel with each other with a predetermined interval interposed therebetween. Accordingly, a mechanism for absorbing tolerance on height sizes of the individual semiconductor elements 51, 56 is required.

With the semiconductor device 111 according to the second embodiment, in particular, a configuration is adopted whereby the bonding surfaces 57, 58, 59, 60 of the IGBT 51, and the diode 56, respectively, are provided with the sintered-metal bonding layers 65, 66, 67, 68, respectively. In order to ensure a necessary thermal conductivity (heat-release properties), and an excellent electrical conductivity with respect to these sintered-metal bonding layers 65, 66, 67, 68, respectively, there is the need for applying a pressure such that bonding target members are brought into intimate contact with each other in the step of bonding.

To describe further about this aspect, in the step of forming the sintered-metal bonding layers, as shown in the step S11-1 of FIG. 2A, a Ag nanoparticle coated with a polymer, not more than 100 nm in grain size, is caused to act on each of the first and second bonding surfaces 57, 59, in pairs, under a heating condition on the order of 100 to 300° C. in, for example, a reducing atmosphere filled with a reducing gas to thereby form the first and second sintered-metal bonding layers 65, 67, respectively.

In the process of this bonding, the polymer is eliminated from the bonding material (for example, the Ag nanoparticle coated with the polymer), or oxygen is removed from the bonding material (for example, silver oxide), whereupon the bonding material undergoes reduction in volume (for example, in the case of using a reducing agent, a volume corresponding to a removed portion of the educing agent is also reduced). This is the reason why there is the need for applying the pressure such that the bonding target members are brought into intimate contact with each other in order to ensure higher denseness, and excellent electrical conductivity with respect to the sintered-metal bonding layer.

Suppose the sintered-metal bonding accompanied by application of a pressure to the second bonding surface 59 of the IGBT 51, and the fourth bonding surface 60 of the diode 56 is executed using both the heat-release member 69, and the heat-release member 70, fixed to the second lead frame 155. In this case, in view of the tolerance on the height sizes of the individual semiconductor elements 51, 56, there occurs variation in pressure (as-unevenly pressed state) of the heat-release member 69, and the heat-release member 70, applied to the second bonding surface 59 of the IGBT 51, and the fourth bonding surface 60 of the diode 56, respectively.

If an applied pressure is increased in as-unevenly pressed state, in particular, this will cause a bonding material to be squeezed out, resulting in conduction failure. Further, if the applied pressure is held back low in order to avoid such a problem, this will cause deterioration in denseness of the sintered-metal bonding layer, or it will become difficult to ensure an excellent electrical conductivity.

Accordingly, with the semiconductor device 111 according to the second embodiment of the invention, there is adopted a configuration whereby the sintered-metal bonding at the IGBT 51, and the diode 56, respectively can be individually executed using the heat-release member 69, and the heat-release member 70, movable independently from each other. With the semiconductor device 111 according to the second embodiment, higher denseness, and excellent electrical conductivity can be ensured with respect to the sintered-metal bonding layer.

(Configuration of a Semiconductor Device 211 According to a Third Embodiment of the Invention)

Figure 4A:
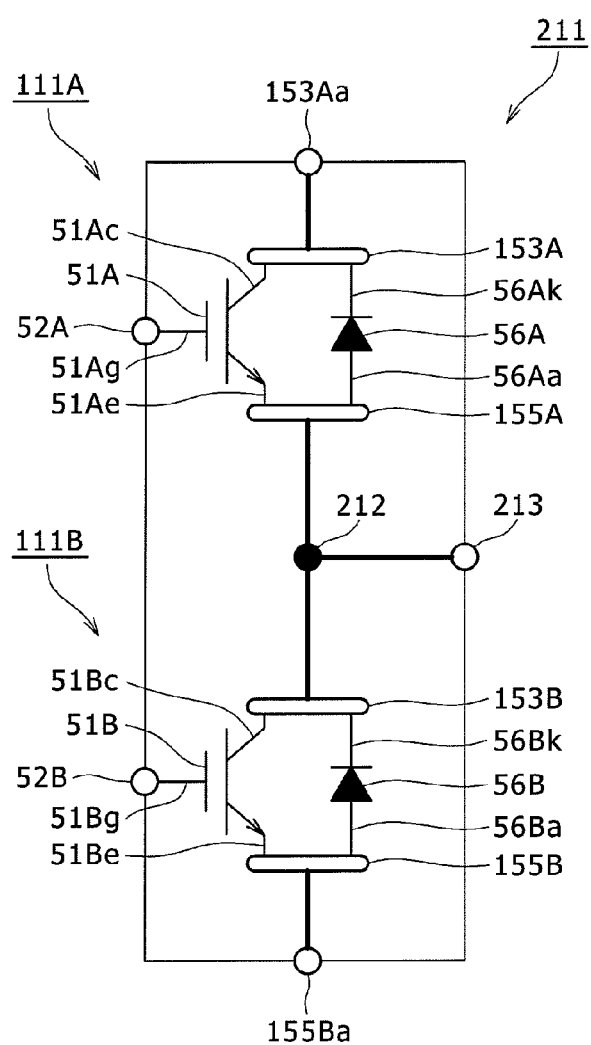
FIG. 4A is an electric circuit diagram of a semiconductor device according to a third embodiment of the invention.
Figure 4B:
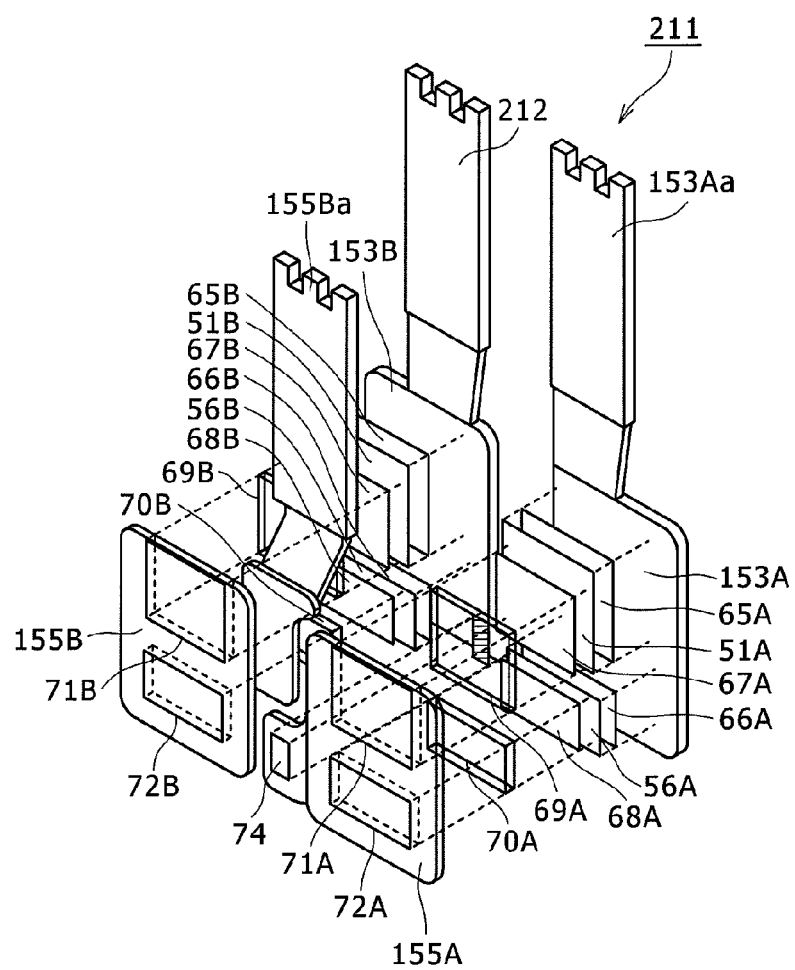
FIG. 4B is an assembly view of the semiconductor device according to the third embodiment, shown in FIG. 4A.
Figure 4C:
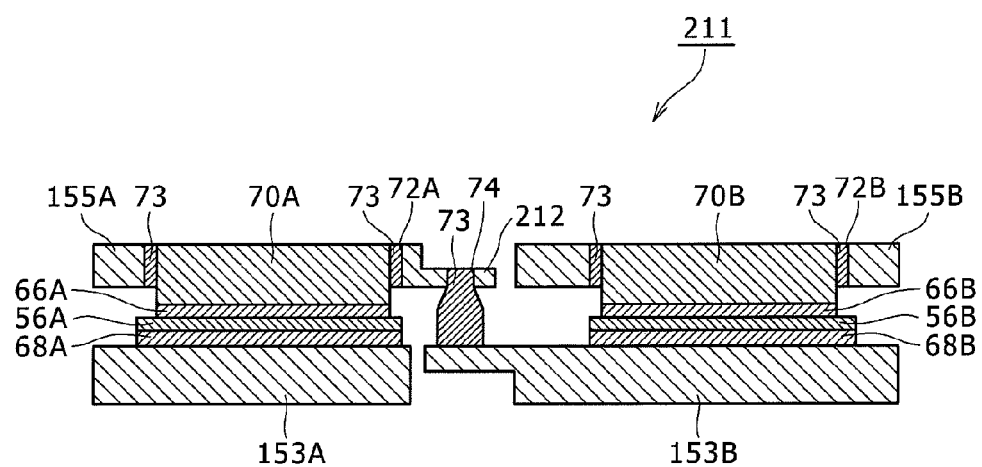
FIG. 4C is a sectional schematic diagram of the semiconductor device according to the third embodiment, shown in FIG. 4A.

Next, a semiconductor device 211 according to the third embodiment of the invention is described hereinafter with reference to FIGS. 4A to 4C, respectively. FIG. 4A is an electric circuit diagram of the semiconductor device 211 according to the third embodiment of the invention. FIG. 4B is an assembly view of the semiconductor device 211 according to the third embodiment, shown in FIG. 4A. FIG. 4C is a sectional schematic diagram showing jointed states on the peripheries of diodes 56, as semiconductor elements of the semiconductor device 211 according to the third embodiment, shown in FIG. 4A.

With the semiconductor device 211 according to the third embodiment of the invention, the semiconductor devices 111 according to the second embodiment of the invention, in pairs, are connected in serried to each other, as show in FIG. 4A, thereby forming an inverter leg for use in a general purpose inverter device.

For the sake of convenience, sign "A" is added to the end of a sign denoting each component of the semiconductor device 111 corresponding to an upper arm of the inverter leg 211, whereas sign "B" is added to the end of a sign denoting each component of the semiconductor device 111 corresponding to a lower arm of the inverter leg 211. A connection node 212 provided between the semiconductor device 111A of the upper arm and the semiconductor device 111B of the lower arm is connected to an output terminal 213. Further, the semiconductor device 111A of the upper arm, and the semiconductor device 111B of the lower arm are each identical in electric circuit configuration to the semiconductor device 111 according to the second embodiment, omitting therefore description thereof.

With the semiconductor device 211 according to the third embodiment of the invention, a first A lead frame (DC positive electrode conduction plate) 153A, and a first B lead frame (first AC conduction plate) 153B are disposed substantially on the same plane, as shown in FIG. 4B. As shown in FIG. 4A, or FIG. 4B, a collector electrode Ac of an IGBT 51A of the upper arm, and a cathode electrode 56Ak of a diode 56A of the upper arm are electrically connected to the first A lead frame 153A via a first A sintered-metal bonding layer 65A, and a third A sintered-metal bonding layer 66A, respectively. Further, a collector electrode Bc of an IGBT 51B of the lower arm, and a cathode electrode $56B_K$ of a diode 56B of the lower arm are electrically connected to the first B lead frame 153B via a first B sintered-metal bonding layer 65B, and a third B sintered-metal bonding layer 66B, respectively, as shown in FIG. 4A, or FIG. 4B.

As shown in FIG. 4A, or FIG. 4B, an emitter electrode Ae of the IGBT 51A of the upper arm, and an anode electrode Aa of the diode 56A of the upper arm are electrically connected to respective surfaces of heat-release members 69, 70, on one side thereof, respectively, via a second A sintered-metal bonding layer 67A, and a fourth A sintered-metal bonding layer 68A, respectively. Further, as shown in FIG. 4A, or FIG. 4B, an emitter electrode Be of the IGBT 51B of the lower arm, and an anode electrode Ba of the diode 56B of the lower arm are electrically connected to respective surfaces of heat-release members 69B, 70B, on one sides thereof, respectively, via a second B sintered-metal bonding layer 67B, and a fourth B sintered-metal bonding layer 68B, respectively.

A second A lead frame (second AC conduction plate) 155A, and a second B lead frame (DC positive electrode conduction plate) 155B are disposed substantially on the same plane. Through-holes 71A, 72A, each thereof having an outer shape slightly larger than an outer shape of each of the respective surfaces of heat-release members 69A, 70A, on the other sides thereof, are opened in the second A lead frame 155A, as shown in FIG. 4B. Further, through-holes 71B, 72B, each hereof having an outer shape slightly larger than an outer shape of each of the respective surfaces of heat-release members 69B, 70B, on the other side thereof, are opened in the second B lead frame 155B, as shown in FIG. 4B.

A solder bonding is applied whereby solder 73 (refer to FIG. 4C) is filled in gaps formed between the outer-side walls of respective sides of the surfaces of the heat-release members 69A, 70A, 69B, 70B, on the other side thereof, and the inner-side walls of the respective through-hole 71A, 72A, 71B, 72B, respectively, whereupon the second A lead frame 155A, and the second B lead frame 155B are electrically connected to the IGBT 51A, and the diode 56A, in the upper arm, and the IGBT 51B, and the diode 56B, in the lower arm, respectively, via the heat-release members 69A, 70A, 69B, 70B, and the sintered-metal bonding layers 67A, 68A, 67B, 68B, respectively.

The first B lead frame 153B is electrically connected to the second A lead frame 155A via an intermediate electrode 212 (connected to the output terminal 213 shown in FIG. 4A). As a result of this connection, the semiconductor device 111A of the upper arm is electrically connected to the semiconductor device 111B of the lower arm. Thereby, the inverter leg 211 in which the semiconductor device 111A of the upper arm is connected in series to the semiconductor device 111B of the lower arm is made up.

Further, a through-hole 74 (refer to FIGS. 4B, and 4C) is made in the second A lead frame 155A. The solder 73 is filled in such a way as to bridge between the second A lead frame 155A and the first B lead frame 153B through the through-hole 74 to thereby realize the inverter leg 211 where the semiconductor device 111A of the upper arm, and the semiconductor device 111B of the lower arm are connected in series. However, electrical connection between the semiconductor device 111A of the upper arm and the semiconductor device 111B of the lower arm may be made by, for example, wire bonding instead of by filling with the solder 73.

(Function Effects of the Semiconductor Device 211 According to the Third Embodiment of the Invention)

With the semiconductor device 211 according to the third embodiment of the invention, it is possible to realize a highly practical inverter leg 211 incorporating the semiconductor elements (the IGBT 51A and the diode 56A in the upper arm, and the IGBT 51B and the diode 56B in the lower arm) excellent in heat-release properties.

[Variations Applicable to the First to Third Embodiments of the Invention, Respectively]

(Semiconductor Devices 111X1 to 111X3 According to First to Third Variations, Respectively)

Figure 5:
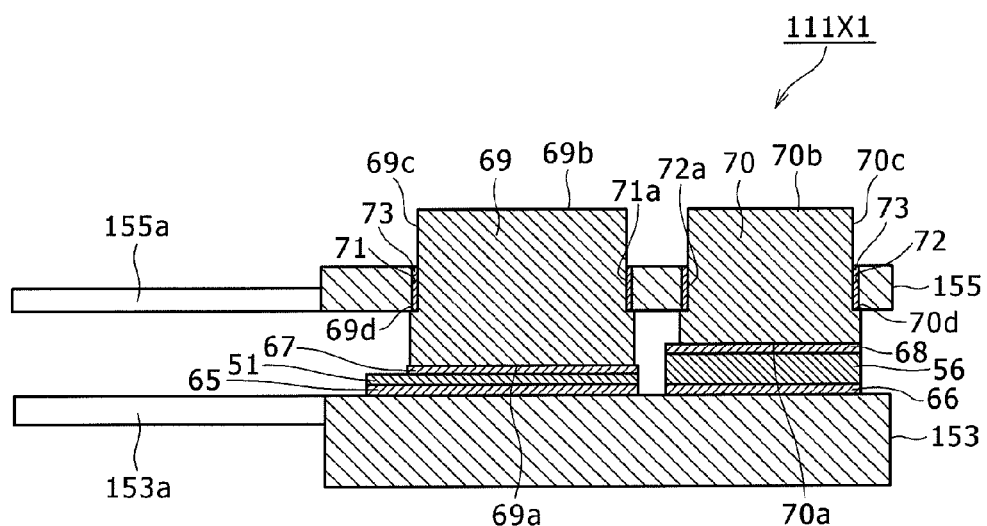
FIG. 5 is a sectional schematic diagram of a semiconductor device according to a first variation applied to the second embodiment of the invention.
Figure 6:
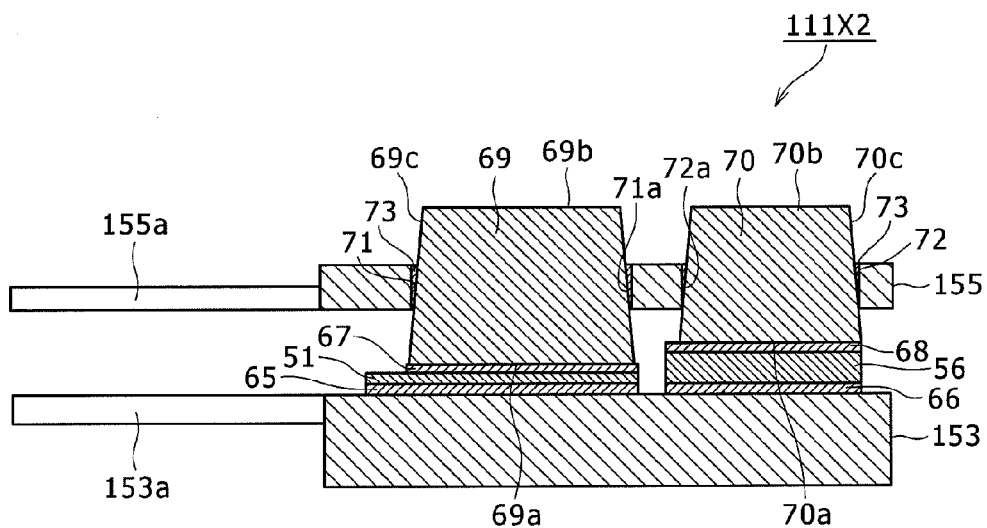
FIG. 6 is a sectional schematic diagram of a semiconductor device according to a second variation applied to the second embodiment of the invention.
Figure 7:
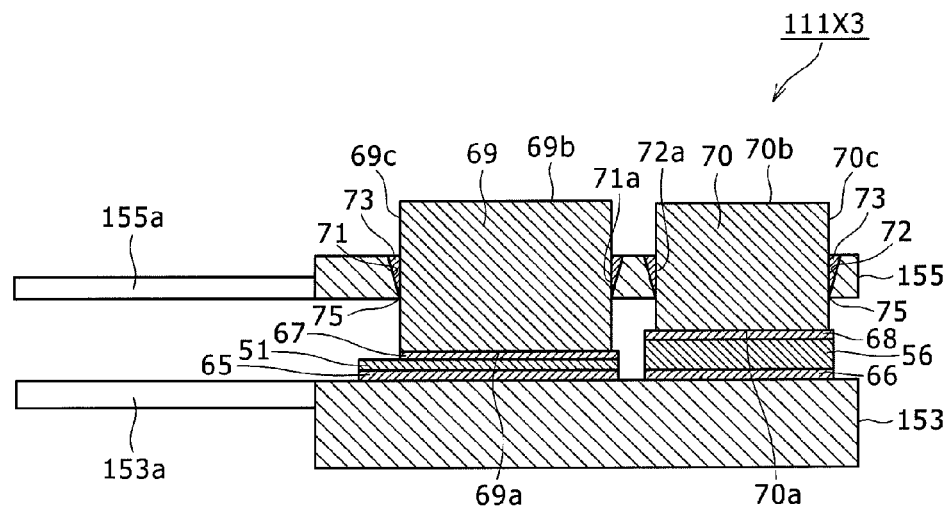
FIG. 7 is a sectional schematic diagram of a semiconductor device according to a third variation applied to the second embodiment of the invention.

Next, the first variation applicable to the first to third embodiments of the invention, respectively, is described hereinafter with reference to FIGS. 5 to 7. FIG. 5 is a sectional schematic diagram of a semiconductor device 111X1 according to the first variation applied to the second embodiment of the invention. FIG. 6 is a sectional schematic diagram of a semiconductor device 111X2 according to the second variation applied to the second embodiment of the invention. FIG. 7 is a sectional schematic diagram of a semiconductor device 111X3 according to the third variation applied to the second embodiment of the invention.

The semiconductor devices 111X1 to 111X3 according to the first to third variations, respectively, are related to a structure for eliminating the need for the jig used in the positioning of the heat-release member 69, and the heat-release member 70 against the first and second lead frame 153, 155, respectively, at the time of making the solder bonding for filling the solder 73 in the gap between, the heat-release member 69 and the first lead frame 153 as well as the gap between the heat-release member 70 and the second lead frame 155 in the semiconductor device 111 according to the second embodiment of the invention, shown in FIG. 3C.

With the semiconductor device 111X1 according to the first variation, the outer-side walls 69c, 70c of the respective sides of the surfaces 69b, 70b, on the other sides of the heat-release members 69, 70, respectively, are provided with circumferential steps, 69d, 70d, respectively, as shown in FIG. 5. The circumferential steps 69d, 70d each have a circumferential shape that is set larger than respective circumferential shapes of the through-holes 71, 72 made in the first and second lead frame 153, 155, respectively.

Thereby, the semiconductor device 111X1 according to the first variation can accept the first, and second lead frames 153, 155 respectively, by the agency of the circumferential steps, 69d, 70d, formed on the heat-release members 69, 70, respectively, while maintaining positioning of the first, and second lead frames 153, 155 without use of a jig such as a pacer, and so forth.

With the semiconductor device 111X2 according to the second variation, a tapering process is applied to the outer-side walls 69c, 70c of the respective sides of the surfaces 69b, 70b, on the other sides of the heat-release members 69, 70, respectively, such that the respective circumferential shapes gradually increase from the side of the surfaces 69a, 70a of the heat-release member 69 70, respectively, on the one side thereof, toward the side of the surfaces 69b, 70b, on the other sides of the heat-release members 69, 70, respectively, as shown in FIG. 6, in place of the circumferential steps 69d, 70d provided in the circumferential shape, in the case of the semiconductor device 111X1 according to the first variation. However, a region where the tapering process is applied may be a part of the circumference of each of the heat-release members instead of the whole circumference thereof.

Thereby, the semiconductor device 111X2 according to the second variation can accept the first, and second lead frames 153, 155 in respective regions where the respective circumferential shapes of the outer-side walls 69c, 70c of the respective heat-release members 69, 70 substantially match the respective circumferential shapes of the through-holes 71, 72, made in the first, and second lead frames 153, 155, respectively, while maintaining the positioning of the first, and second lead frames 153, 155 without use of a jig such as a pacer, and so forth.

With the semiconductor devices 111X1, 111X2 according to the first and second variations, respectively, the circumferential steps 69d, 70d are provided on the respective sides of the heat-release members 69, 70, or the tapering process is applied to the outer-side walls 69c, 70c, respectively. In contrast, with the semiconductor device 111X3 according to the third variation, the circumferential shapes of the respective sides of the heat-release members 69, 70 remain the same as in the case of the second embodiment.

And a tapering process is applied to the respective circumferential shapes of the inner-side walls 71a 72a of the through-holes 71, 72, respectively, made in the second lead frame 155, such that the respective circumferential shapes gradually increase from the lower side toward the upper side. However, a region where the tapering process is applied may be a part of the circumference of each of the inner-side walls instead of the whole circumference thereof. The respective circumferential shapes of necks 75 on the respective side of the IGBT 51, and the diode 56, representing the narrowest parts of the respective circumferential shapes of the inner-side walls 71a 72a with the tapering process applied thereto are set so as to be substantially equal to the respective circumferential shapes of the outer-side walls 69c, 70c of the heat-release members 69, 70, respectively.

Thereby, the semiconductor device 111X3 according to the third variation can accept the first, and second lead frames 153, 155, respectively, by causing the necks 75 that are the narrowest parts of the respective circumferential shapes of the inner-side walls 71a 72a to be engaged with the respective outer-side walls 69c, 70c of the heat-release members 69, 70 by frictional force at the time when the heat-release members 69, 70 are fitted into the through-holes 71, 72 opened in the second lead frame 155, while maintaining the positioning of the first, and second lead frames 153, 155, without use of a jig such as a pacer, and so forth.

Further, when a molten solder 73 is poured dropwise between the heat-release member 69 and the first lead frame 153 as well as between the heat-release member 70 and the second lead frame 155 to thereby carryout bonding by filling respective gaps, an opening can be rendered larger to thereby facilitate a bonding work.

With the semiconductor devices 111X1 to 111X3 according to the first to third variations, respectively, when molten solder 73 is poured dropwise into the gap between the heat-release member 69 and the first lead frame 153 as well as the gap between the heat-release member 70 and the second lead frame 155, the molten solder 73 is spread across owing to capillarity. From the standpoint of achieving enhancement in workability of the solder bonding, a layer for enhancement of surface wettability may be plated on at least either one of the respective outer-side walls 69c, 70c of the heat-release members 69, 70, or the respective inner-side walls 71a 72a of the through-holes 71, 72, opened in the first, and second lead frame 153, 155, respectively. There is no cause for concern with a solder material provided that the melting point thereof is lower than that of the sintered metal. An Sn, Bi, Zn, or Au based material can therefore be used as appropriate.

(Semiconductor Devices 111Y1, 111Y2 According to Fourth, Fifth Variations, Respectively)

Figure 8:
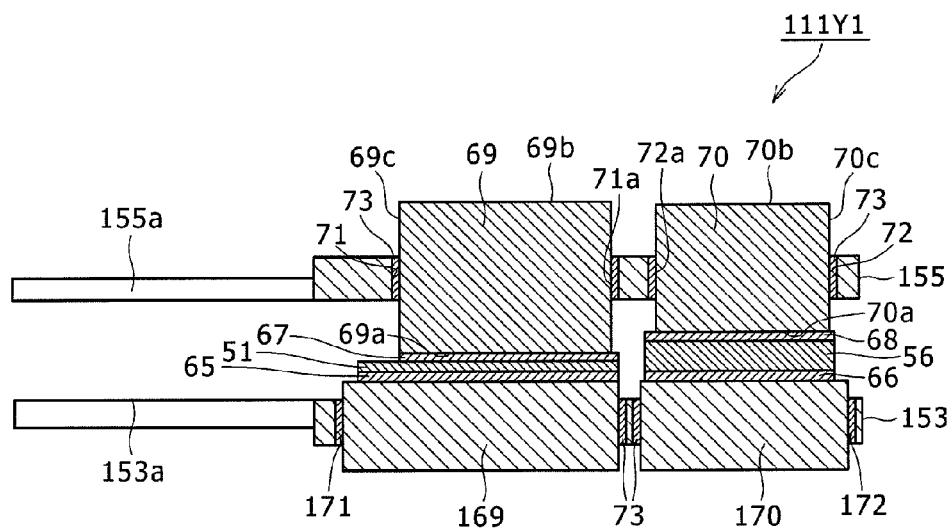
FIG. 8 is a sectional schematic diagram of a semiconductor device according to a fourth variation applied to the second embodiment of the invention.
Figure 9:
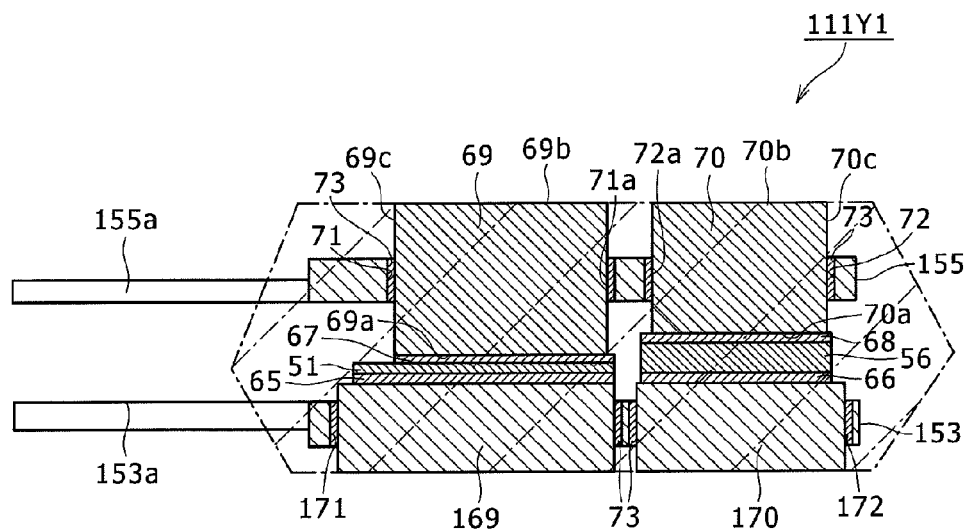
FIG. 9 is a sectional schematic diagram of a semiconductor device according to a fifth variation applied to the second embodiment of the invention.

The fourth, fifth variations applicable to the first to the third embodiments of the invention, respectively, are described hereinafter with reference to FIGS. 8, and 9. FIG. 8 is a sectional schematic diagram of the semiconductor device 111Y1 according to the fourth variation applied to the second embodiment of the invention. FIG. 9 is a sectional schematic diagram of the semiconductor device 111Y2 according to the fifth variation applied to the second embodiment of the invention.

With the semiconductor device 111Y1 according to the fourth variation, in order to further enhance the heat-release effects of the IGBT 51, and the diode 56, serving as the semiconductor element, respectively, the IGBT 51, and the diode 56, bonded to the first lead frame 153 through the intermediary of the first, and third sintered-metal bonding layer 65, 66, respectively, are bonded to newly installed heat-release members 169, 70, respectively, in the semiconductor device 111 according to the second embodiment of the invention, shown in FIG. 3C.

In short, the semiconductor device 111Y1 according to the fourth variation adopts a so-called double-sided heat release structure whereby the IGBT 51, and the diode 56 are solder-bonded to respective inner-side walls of the through-holes 171, 172, opened in the first lead frame 153, through the heat-release member 169, 170 bonded to the first, and third sintered-metal bonding layer 65, 66, respectively, as shown in FIG. 8.

With the semiconductor device 111Y1 according to the fourth variation, since it is possible to concurrently manufacture a multitude of units made up by bonding the heat-release members 69, 169, 70, 170 to each of the bonding surfaces, in pairs, in the IGBT 51, and the diode 56, respectively, for every semiconductor ships of the IGBT 51, and the diode 56, respectively, the semiconductor device 111Y1 suitable for mass production of semiconductor devices can be provided.

Further, a configuration can be adopted whereby individual units are individually inspected, and subsequently, the individual units are bonded to the first and second lead frames 153, 155, respectively, so that the yield of the semiconductor device 111Y1 can be improved.

Furthermore, those units are each manufactured by the sintered-metal bonding insusceptible to re-melting at the melting point of the solder 73, so that, supposing that any trouble occurs to a semiconductor chip of the IGBT 51, or the diode 56 when the individual units are solder-bonded to the first, and second lead frames 153, 155, respectively, in the back-end step, a work for re-melting the solder to release the solder bonding to thereby remove the semiconductor ship can be easily executed, thereby ensuring excellent repairability.

Next, with the semiconductor device 111Y2 according to the fifth variation, a sealing structure with the use of a resin is adopted in order to reduce thermal stress inside the device to thereby aim at contribution to a longer service life of the semiconductor device. An embodiment of FIG. 9 shows a structure where the semiconductor device 111Y1 according to the fourth variation in whole is sealed with a resin 311.

Respective stock materials of the IGBT 51 and the diode 56 differ in thermal expansion coefficient from respective stock material of the first, and second lead frames 153, 155. For this reason, thermal stress occurs inside the semiconductor device 111Y2 according to the fifth variation due to heat generation at a chip. The structure for resin-sealing, shown in FIG. 9, is effective for reducing a difference in thermal expansion coefficient between those stock materials, and lowering the thermal stress occurring due to a rise in temperature at the time of an application environment to thereby achieve a longer service life of the semiconductor device 111Y2.

As the resin 311 used in the sealing, use can be suitably made of a resin based on, for example, a novolac base, a multifunctional base, or a biphenyl base epoxy resin. The thermal expansion coefficient of the resin 311 can be adjusted by causing the resin 311 to contain a ceramic, such as $SiO_2$, $Al_2O_3$, AlN, BN, and so forth, gel, rubber, and so forth. In this case, the resin-sealing is executed using a transfer molding.

The transfer • molding refers to a step of setting up a lead frame with bonding already applied thereto in a molding press, and pouring a resin as-fluidized state by raising temperature therein under pressure (to transfer under pressure) to thereby implement molding. In the case of the semiconductor device 111Y2 according to the fifth variation, both the parallelism, and the positioning with respect of the first, and second lead frames 153, 155, and the heat-release members 69, 169, 70, 170, respectively, are under controls, so that the risk of occurrence of a failure such as breakage due to mold-clamping does not exist.

With the semiconductor device 111Y2 subjected to the resin-sealing, a treatment for enhancement of adhesion strength with the resin 311 is applied to the respective surfaces of the first, and second lead frames 153, 155. By "a treatment for enhancement of adhesion strength with the resin 311" is meant a treatment including oxidation, surface roughening, and organic-matter coating. However, if the treatment is applied to the respective inner-side walls of the through-holes 71, 72, 171, 172, as the bonding surface, this will render the bonding surface susceptible to failure at the time of the solder bonding.

Accordingly, the treatment for enhancement of adhesion strength with the resin 311 is first applied and subsequently, the through-holes 71, 72, 171, 172 are each formed. Thereby, surfaces differing from each other can be easily formed from the standpoint of enhancing the adhesion strength with the resin 311 between each of other surface parts and the respective inner-side walls of the through-holes 71, 72, 171, 172. In the case of a related art technology, it has been a common practice to apply a cumbersome surface treatment using a mask to be followed by a partial treatment. In this respect, if a procedure for the treatment described as above is adopted, the partial treatment can be carried out with extreme ease.

With respect to, for example, the heat-release members 69, 169, 70, 170, if these are each cut out from a stock subjected to a heat treatment in advance, this will enable surfaces suitable for treatments differing from each other, depending on usage thereof, such as, for example, upper/lower surfaces, and a side (lateral face), to be created. In the case of adopting a lead frame in a flat-plate like shape, it is possible to easily realize that each of plural surfaces of the lead frame is a surface-treated face as required using a treatment procedure described as above.

(Semiconductor Devices 111Z1, 111Z2 According to Sixth, Seventh Variations, Respectively)

Figure 10:
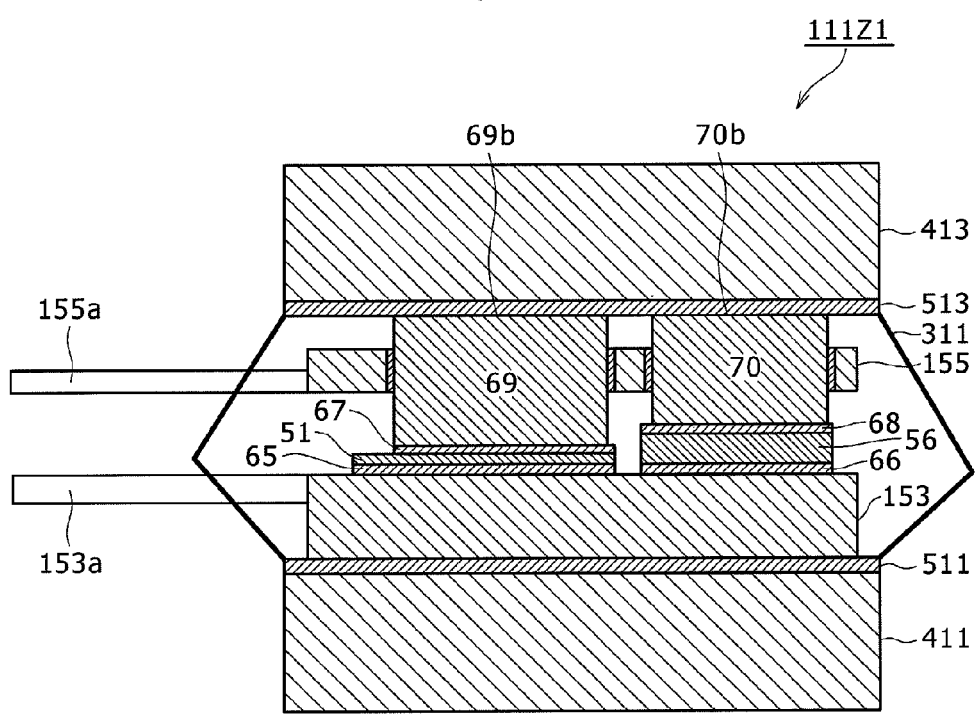
FIG. 10 is a sectional schematic diagram of a semiconductor device according to the sixth variation applied to the second embodiment of the invention.
Figure 11:
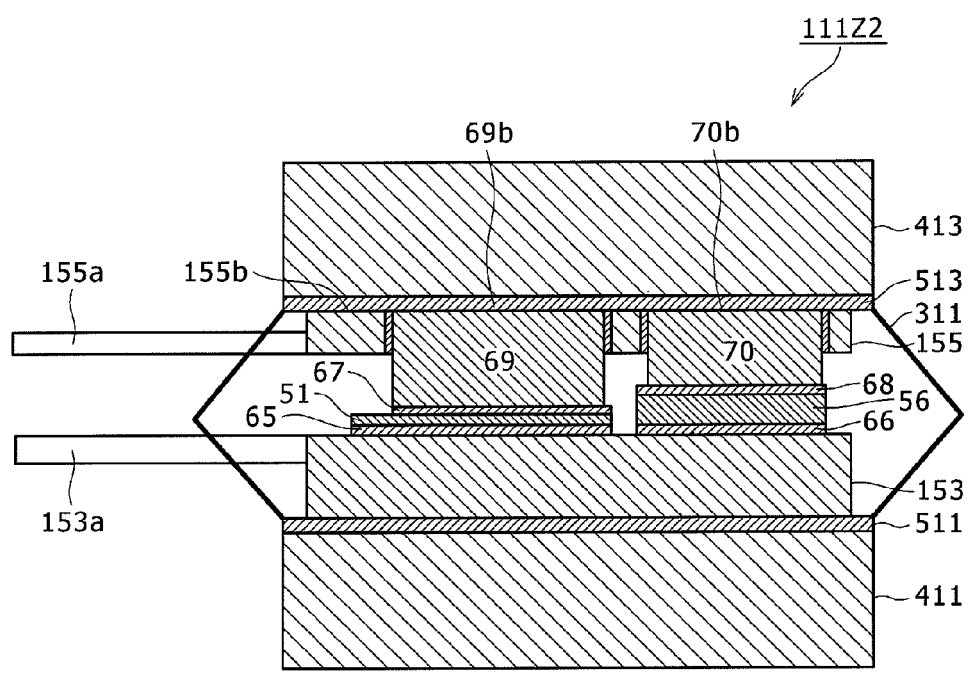
FIG. 11 is a sectional schematic diagram of a semiconductor device according to a seventh variation applied to the second embodiment of the invention.

The sixth and seventh variations applicable to the first to the third embodiments of the invention respectively are described hereinafter with reference to FIGS. 10 and 11. FIG. 10 is a sectional schematic diagram of the semiconductor device 111Z1 according to the sixth variation applied to the second embodiment of the invention. FIG. 11 is a sectional schematic diagram of the semiconductor device 111Z2 according to the seventh variation applied to the second embodiment of the invention.

With the semiconductor device 111Z1 according to the sixth variation, in order to still further enhance the heat-release effects of the IGBT 51 and the diode 56 as the semiconductor element, respectively, and to reduce thermal stress inside the device to thereby aim at contribution to a longer service life of the semiconductor device, in the semiconductor device 111 according to the second embodiment of the invention shown in FIG. 3C, the structure for resin-sealing is adopted as shown in FIG. 10, and cooling mechanisms 411, 413 having cooling fins are attached to the semiconductor device with the structure for resin sealing adopted therein via electrically insulating layers 511, 513, respectively.

The cooling mechanisms 411, 413 each have the cooling fins (not shown) made of a stock material high in thermal conductivity, such as, for example, aluminum. The cooling mechanisms 411, 413 each may adopt a configuration whereby a cooling water flow path (not shown) is provided in close proximity of the cooling fins.

For the electrically insulating layers 511, 513, respectively, use can be made of a high-heat conducting resin sheet containing fillers (not shown). Stickiness is given to both the surfaces of each of the high-heat conducting resins sheets (the electrically insulating layers) 511, 513. Thereby, the semiconductor device with the structure for resin-sealing adopted therein can be bonded to the cooling mechanisms 411, 413 with each of the high-heat conducting resin sheets (the electrically insulating layers) 511, 513 being interposed therebetween.

For the filler contained in each of the high-heat conducting resin sheets 511, 513, there can be used a ceramic having electrical insulating properties and a high thermal conductivity such as $SiO_2$, $Al_2O_3$, AlN, BN, and so forth. For a resin serving as the matrix of the high-heat conducting resin sheets 511, 513, there can be used a resin based on one material selected from the group consisting of a sticky phenol base, acrylic base, polyimide base, polyamide-imide base, bis-maleimide-triazine, and cyanate-ester based materials. In the case of using a resin based on one material selected from the group consisting of bis-maleimide-triazine, polyamide-imide, cyanate-ester, epoxy, and phenol base materials, high in adhesiveness, in particular, as the resin serving as the matrix of the high-heat conducting resin sheets 511, 513, respectively, the high-heat conducting resin sheets 511, 513 are insusceptible to exfoliation after bonding, so that the service life of the semiconductor device can be enhanced.

As a variation of each of the electrically insulating layers 511, 513, a high-heat conducting resin sheet containing fillers having electrical insulating properties, or a plate made of sintered ceramics, such as alumina, aluminum nitride, silicon nitride, and so forth, may be adhered to a side of the semiconductor device, adjacent to the surfaces 69b, 70b, on the other sides of the heat-release members 69, 70, respectively, via a grease, or a high-heat conducting resin sheet containing fillers having a high thermal conductivity may be adopted. Further, a sintered ceramics layer formed by a thermal spraying method or an aerosol deposition method may be adhered, or bonded to respective sides of the surfaces 69b, 70b, on the other sides of the heat-release members 69, 70, respectively, via a resin, or grease.

The surfaces 69b, 70b of the heat-release members 69, 70, on the other sides thereof, respectively, are provided such that the respective sides thereof are in parallel with the first, and second lead frames 153, 155, respectively, and are flush with each other (planarized), as shown in FIG. 10. Thereby, a thickness of the electrically insulating layer 513 can be set to the smallest thickness as far as the electrical insulating properties thereof can be ensured. As a result, thermal resistance of the electrically insulating layer 513 can be reduced. However, in case that the respective sides of the surfaces 69b, 70b, on the other sides of the heat-release members 69, 70, respectively, are not flush with each other (planarized), surfaces corresponding to the respective sides of the surfaces 69b, 70b, on the other sides of the heat-release members 69, 70, respectively, may be polished, or ground to be thereby planarized.

With the semiconductor device 111Z2 according to the seventh variation, the second lead frame 155 is installed such that an upper side surface 155b thereof will be flush with the respective surfaces 69b, 70b, on the other sides of the heat-release members 69, 70, and the electrically insulating layer 513 according the sixth variation is provided on a side where those surfaces are flush with each other, as shown in FIG. 11.

In order to render the upper side surface 155b of the second lead frame 155 flush with the respective surfaces 69b, 70b, on the other sides of the heat-release members 69, 70, respectively, it need only be sufficient to adjust, for example, the respective heights of the heat-release members 69, 70. In this case, the heat-release members 69, 70, differing in height size from each other, may be prepared in advance to thereby selectively use heat-release members 69, 70, having an adequate height size, respectively, from among those heat-release members that have already been prepared. However, a configuration may be adopted whereby grinding is applied to a surface in such as a state as the upper side surface 155b of the second lead frame 155 is not flush with the respective surfaces 69b, 70b, on the other sides of the heat-release members 69, 70, respectively, to thereby render those surfaces flush with each other.

With the semiconductor device 111Z2 according to the seventh variation, both the upper side surface 155b of the second lead frame 155, and the respective surfaces 69b, 70b, on the other sides of the heat-release members 69, 70, respectively, can be formed as heat-release surfaces that are flush with each other, so that heat-release properties can be enhanced due to an increase in the area of the heat-release surfaces.

(Semiconductor Device 111Y3 According to an Eighth Variation)

Figure 12A:
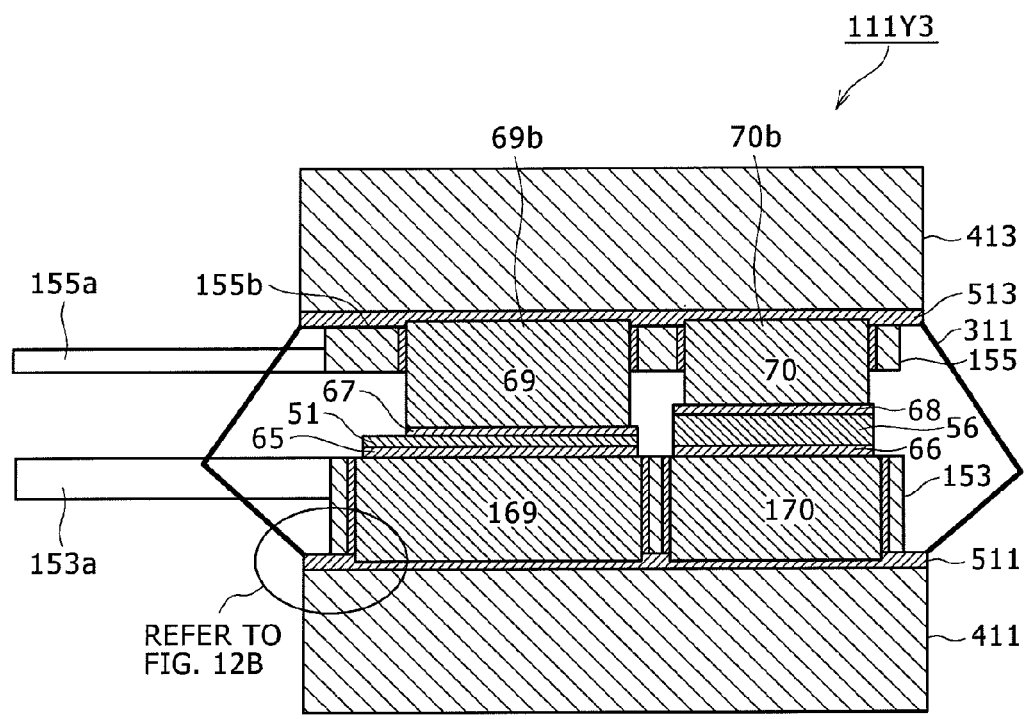
FIG. 12A is a sectional schematic diagram of a semiconductor device according to an eighth variation applied to the semiconductor device according to the fourth variation shown in FIG. 8.
Figure 12B:
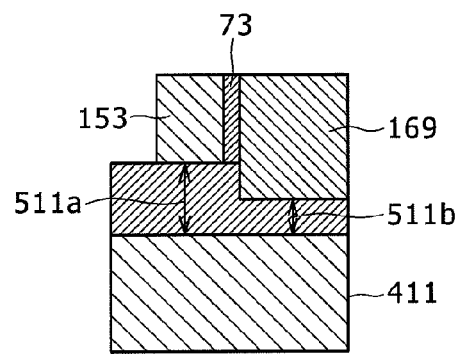
FIG. 12B is a schematic representation showing an enlarged principal part of the semiconductor device according to the eighth variation, shown in FIG. 12A.

Next, an eighth variation applicable to the first to third embodiments of the invention, respectively, is described hereinafter with reference to FIGS. 12A, and 12B. FIG. 12A is a sectional schematic diagram of the semiconductor device 111Y3 according to the eighth variation applied to the semiconductor device 111Y1 according to the fourth variation shown in FIG. 8. FIG. 12B is a schematic representation showing an enlarged principal part of the semiconductor device 111Y3 according to the eighth variation, shown in FIG. 12A.

With the semiconductor device 111Y3 according to the eighth variation, in order to still further enhance the heat-release effects of the IGBT 51, and the diode 56, serving as the semiconductor element, respectively, and to reduce thermal stress inside the device to thereby aim at contribution to a longer service life of the semiconductor device, in the semiconductor device 111Y1 according to the fourth variation shown in FIG. 8, the structure for resin-sealing is adopted, and cooling mechanisms 411, 413, having cooling fins, are attached to the semiconductor device with the structure for resin-sealing adopted therein, via electrically insulating layers 511, 513, respectively.

To describe in detail, the semiconductor device 111Y3 according to the eighth variation is installed such that the respective sides (lateral faces) of the surfaces 69b, 70b, on the other sides of the heat-release members 69, 70, respectively, protrude from above the first and second lead frame 153, 155, respectively, toward a side of the semiconductor device, opposite from the IGBT 51, and the diode 56 (the semiconductor elements), respectively, through through-holes 71, 72, 171, 172, respectively, as shown in FIG. 12A. Further, the electrically insulating layers 511, 513 according to the sixth variation are provided so as to cover all the surfaces on the side of the semiconductor, opposite from the IGBT 51, and the diode 56, respectively, and all the surfaces of the heat-release members 69, 70, 169, 170, on the other sides thereof, respectively.

In the case of the electrically insulating layers 511, 513, the larger a thickness is, the more thermal stress can be generally reduced, whereas heat-release properties undergoes deterioration. Meanwhile, a region where thermal stress occurring to the electrically insulating layers 511, 513, respectively, is at the maximum is an end part 511a in the electrically insulating layers 511, 513, butted against the first and second lead frame 153, 155, respectively. Further, a region 511b that is butted against a part of a main path for release of heat generated at the IGBT 51, and the diode 56, respectively, is interposed in the electrically insulating layers 511, 513, butted against the first and second lead frame 153, 155, respectively.

Accordingly, with the semiconductor device 111Y3 according to the eighth variation, a configuration is adopted whereby the semiconductor device is installed such that the respective sides (lateral faces) of the surfaces 69b, 70b, on the other sides of the heat-release members 69, 70, respectively, protrude from above the first and second lead frame 153, 155, respectively, toward the side of the semiconductor device, opposite from the IGBT 51, and the diode 56, respectively, through the through-holes 71, 72, 171, 172, respectively.

With the semiconductor device 111Y3 according to the eighth variation, the thickness of the end part 511a in the electrically insulating layers 511, 513, bonded to the respective sides of the first and second lead frame 153, 155, on the side of the semiconductor device, opposite from the IGBT 51, and the diode 56, (the semiconductor elements), is set larger as compared with the thickness of the insulating resin layer bonded to the respective sides of the surfaces of the heat-release members 69, 70, 169, 170, on the other sides thereof, respectively, so that thermal stress can be relieved while inhibiting deterioration in heat-release properties.
(Semiconductor Devices 111Y4, 111Y5 According to Ninth, Tenth Variations, Respectively)

Figure 13:
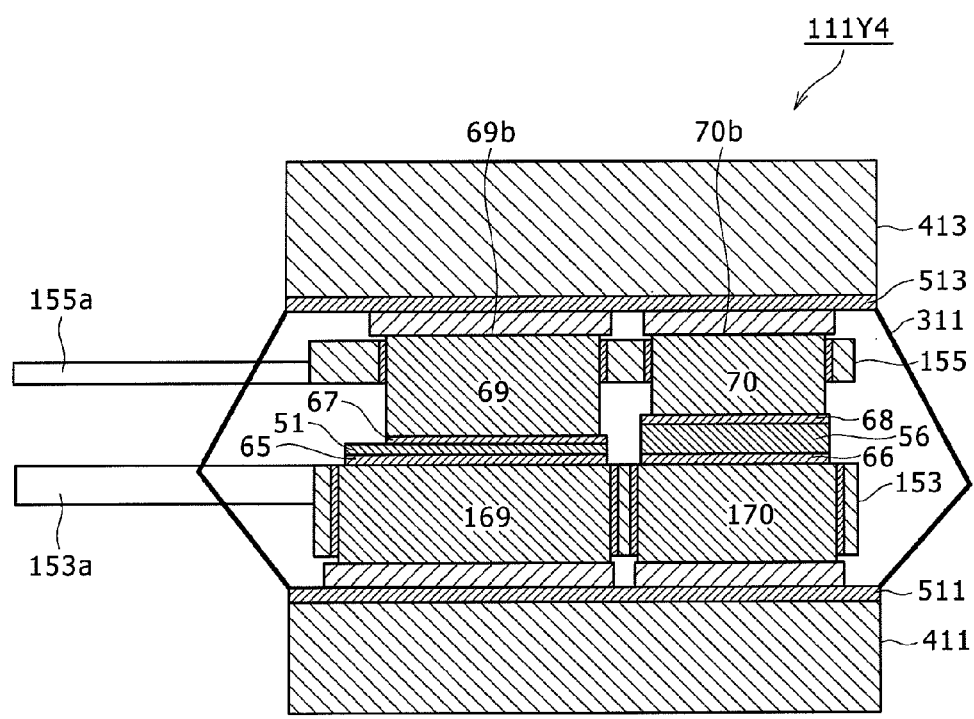
FIG. 13 is a sectional schematic diagram of a semiconductor device according to a ninth variation applied to the semiconductor device according to the eighth embodiment of the invention, shown in FIG. 12.
Figure 14:
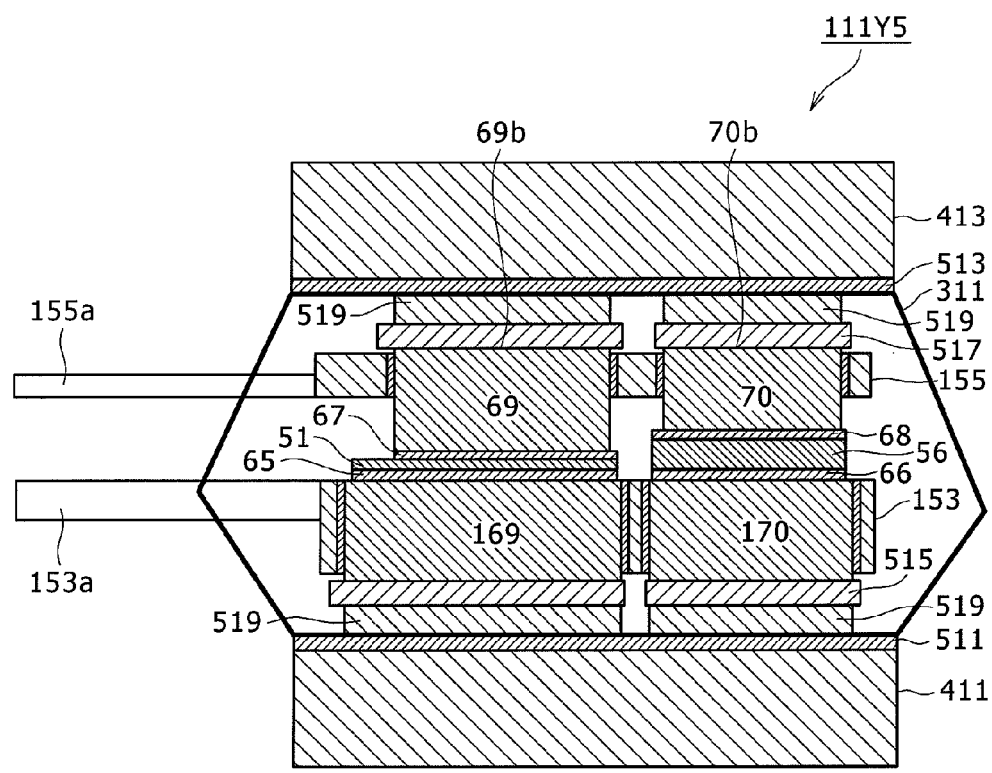
FIG. 14 is a sectional schematic diagram of a semiconductor device according to a tenth variation applied to the semiconductor device according to the ninth variation, shown in FIG. 13.

The ninth, tenth variations, applicable to the first to the third embodiments of the invention, respectively, are described hereinafter with reference to FIGS. 13, and 14. FIG. 13 is a sectional schematic diagram of the semiconductor device 111Y4 according to the ninth variation applied to the semiconductor device 111Y3 according to the eighth embodiment of the invention, shown in FIG. 12. FIG. 14 is a sectional schematic diagram of the semiconductor device 111Y5 according to the tenth variation applied to the semi conductor device 111Y4 according to the ninth variation, shown in FIG. 13.

With the semiconductor device 111Y4 according to the ninth variation, in order to still further enhance the heat-release effects of the IGBT 51, and the diode 56, as the semiconductor element, respectively, and to reduce thermal stress inside the device to thereby aim at contribution to a longer service life of the semiconductor device, the cooling mechanisms 411, 413, having the cooling fins, are attached to the semiconductor device with the structure for resin-sealing adopted therein, via other electrically insulating layers 515, 517 different from the electrically insulating layers 511, 513, respectively, in the semiconductor device 111Y3 according to the eighth variation shown in FIG. 12A, in place of, or in addition to the electrically insulating layers 511, 513, as shown in FIG. 13.

For the other electrically insulating layers 515, 517, a configuration is adopted whereby a plate made of sintered ceramics, such as alumina, aluminum nitride, silicon nitride, and so forth, is tightly bonded to the respective sides of the surfaces, on the other sides of the heat-release members 69, 70, 169, 179, respectively, by brazing, and diffusion bonding. With the semiconductor device 111Y4 according to the ninth variation, the electrically insulating layers 511, 513 each can be replaced with a member having electrical conductivity. Upon such replacement, a stock material having high thermal conductivity can be selected as appropriate from among various materials, such as resin, grease, solder, and so forth, to be put to use.

With the semiconductor device 111Y5 according to the tenth variation, a metalized layer 519 is provided between the respective electrically insulating layers 515, 517, and the respective cooling mechanisms 411, 413, as shown in FIG. 14, in the semiconductor device 111Y4 according to the ninth variation, shown in FIG. 13. With the semiconductor device 111Y5 according to the tenth variation, a setting work can be easily executed after molding of the semiconductor device, the setting work being for grinding plural surfaces on a side of the metalized layer 519, opposite from the IGBT 51, and the diode 56 (the semiconductor elements), to thereby render the plural surfaces flush with each other.

Other Embodiments

The first to the third embodiments of the invention, and the first to tenth variations applied thereto are each a specific example for implementing the present invention. It is therefore to be understood that the technical scope of the invention be not limited by any of the details of the description in the foregoing because various changes and modification may be made in the invention without departing from the spirit and scope thereof.

For example, with respect to each of the first to the third embodiments of the invention, and the first to tenth variations applied thereto, a part of the configuration thereof can be replaced with a configuration described in other embodiments or other variations. Further, a configuration described in other embodiments or other variations can be added to the configuration described in a specific embodiments or a specific variation. Furthermore, a part of the configuration described in each of the first to the third embodiments of the invention, and the first to tenth variations applied thereto, can be deleted without departing from the spirit and scope of the invention.

What is claimed is:

1. A semiconductor device comprising:
a vertical semiconductor element having bonding surfaces, in pairs, the bonding surfaces being provided between bus bars, in pairs, the bus bars being opposed to each other;
a sintered-metal bonding layer made of a sintered-metal, provided on each of the bonding surfaces, in pairs;
a through-hole opened in at least one of the bus bars, in pairs; and
a heat-release member having electrical conductivity, and a high thermal conductivity as compared with solder, a surface of the heat-release member, on one side thereof, being bonded to the sintered-metal bonding layer on at least one of the bonding surfaces, in pairs, while a side (a lateral face) of a surface of the heat-release member, on the other side thereof, being fitted into the through-hole,
wherein a solder layer is formed in a gap between an outer-side wall of the side of the surface of the heat-release member, on the other side thereof, and an inner-side wall of the through-hole opened in at least the one of the bus bars, in pairs.

2. The semiconductor device according to claim 1, comprising:
a plurality of vertical semiconductor elements, each thereof, having bonding surfaces, in pairs, the bonding surfaces being provided between bus bars, in pairs, the bus bars being opposed to each other;
a sintered-metal bonding layer made of a sintered-metal, provided on each of the bonding surfaces, in pairs;
a plurality of through-holes opened in at least one of the bus bars, in pairs; and
a plurality of heat-release members, each thereof, having electrical conductivity, and a high thermal conductivity, as compared with solder, a surface of the heat-release member, on one side thereof, being bonded to the sintered-metal bonding layer on at least one of the bonding surfaces, in pairs, while a side (a lateral face) of a surface of the heat-release member, on the other side thereof, being fitted into the through-hole,
wherein a solder layer is formed in respective gaps formed between the respective outer-side walls of the sides of the respective surfaces of the heat-release members, on the other side thereof, and the respective inner-side walls of the through-hole opened in at least the one of the bus bars, in pairs.

3. The semiconductor device according to claim 1, wherein a tapering process is applied to at least either the outer-side wall of the side of the surface of the heat-release member, on the other side thereof, or the inner-side wall of the through-hole opened in at least the one of the bus bars, in pairs.

4. The semiconductor device according to claim 1, wherein the thermal expansion coefficient of the heat-release member is set to a numerical value within a scope divided by the thermal expansion coefficient of the semiconductor element, and the respective thermal expansion coefficients of the bus bars, in pairs, as respective boundary values.

5. The semiconductor device according to claim 1, wherein a surface treatment with adhesion with solder being taken into consideration is applied to at least either the outer-side wall of the side of the surface of the heat-release member, on the other side thereof, or the inner-side wall of the through-hole opened in at least the one of the bus bars, in pairs.

6. The semiconductor device according to claim 1, wherein at least a part of the bus bars, in pairs, and the side of the surface of the heat-release member, on the other side thereof, are sealed by a resin material having electrical insulating properties.

7. The semiconductor device according to claim 6, wherein surface roughening is applied to a bonding surface with the resin material in the bus bar.

8. The semiconductor device according to claim 6, wherein a cooling mechanism is provided on a side of the semiconductor device, adjacent to the surface of the heat-release member, on the other side thereof, via an electrically insulating layer.

9. The semiconductor device according to claim 8, wherein the side of the surface of the heat-release member, on the other side thereof, protrudes from above the bus bar, toward a side of the semiconductor device, opposite from the semiconductor element through the through-hole, and the thickness of the electrically insulating layer bonded to a side of the bus bar, opposite from the semiconductor elements, is set larger as compared with the thickness of an insulating resin layer bonded to the side of the surface of the heat-release member, on the other side thereof.

10. The semiconductor device according to claim 6, wherein a planarizing processing by grinding is applied to a side of the surface, on the other side of the heat-release member.

* * * * *